(12) United States Patent
Kouno et al.

(10) Patent No.: US 7,546,178 B2
(45) Date of Patent: **\*Jun. 9, 2009**

(54) ALIGNER EVALUATION SYSTEM, ALIGNER EVALUATION METHOD, A COMPUTER PROGRAM PRODUCT, AND A METHOD FOR MANUFACTURING A SEMICONDUCTOR DEVICE

(75) Inventors: Takuya Kouno, Kanagawa (JP); Shigeki Nojima, Kanagawa (JP); Tatsuhiko Higashiki, Kanagawa (JP)

(73) Assignee: Kabushiki Kaisha Toshiba, Tokyo (JP)

( \* ) Notice: Subject to any disclaimer, the term of this patent is extended or adjusted under 35 U.S.C. 154(b) by 0 days.

This patent is subject to a terminal disclaimer.

(21) Appl. No.: 11/882,620

(22) Filed: Aug. 3, 2007

(65) Prior Publication Data

US 2007/0288113 A1 Dec. 13, 2007

Related U.S. Application Data

(62) Division of application No. 10/636,625, filed on Aug. 8, 2003, now Pat. No. 7,269,470.

(30) Foreign Application Priority Data

Aug. 9, 2002 (JP) ............................ 2002-234053

(51) Int. Cl.
*G06F 19/00* (2006.01)
*G06F 17/50* (2006.01)

(52) U.S. Cl. ..................... 700/121; 700/109; 716/21; 702/184; 703/13

(58) Field of Classification Search .................. 700/109, 700/110, 120, 121, 124, 108; 702/81, 82, 702/84, 182, 183, 85, 184; 703/13, 14; 716/19, 716/21; 356/400, 401; 257/E21.53
See application file for complete search history.

(56) References Cited

U.S. PATENT DOCUMENTS 5,675,495 A 10/1997 Biermann et al.
5,801,954 A 9/1998 Le et al.

(Continued)

FOREIGN PATENT DOCUMENTS

EP 1 217 448 A2 6/2002

(Continued)

OTHER PUBLICATIONS

Notice of Grounds for Rejection issued by the Japanese Patent Office on Jun. 6, 2006, for Japanese Application No. 2002-234053, and English-language translation thereof.

(Continued)

*Primary Examiner*—Charles R Kasenge
(74) *Attorney, Agent, or Firm*—Finnegan, Henderson, Farabow, Garrett & Dunner, L.L.P.

(57) ABSTRACT

An aligner evaluation system includes (a) an error calculation module configured to calculate error information on mutual optical system errors among a plurality of aligners; (b) a simulation module configured to simulate device patterns to be delineated by each of the aligners based on the error information; and (c) a evaluation module configured to evaluate whether each of the aligners has appropriate performances for implementing an organization of a product development machine group based on the simulated device pattern.

18 Claims, 14 Drawing Sheets

U.S. PATENT DOCUMENTS

| | | | |
|---|---|---|---|
| 5,879,844 | A | 3/1999 | Yamamoto et al. |
| 6,011,611 | A | 1/2000 | Nomura et al. |
| 6,014,456 | A | 1/2000 | Tsudaka |
| 6,404,483 | B1 | 6/2002 | Segers et al. |
| 6,437,858 | B1 | 8/2002 | Kouno et al. |
| 6,697,698 | B2 | 2/2004 | Yoshitake et al. |
| 6,787,789 | B2 | 9/2004 | Van Der Laan |
| 6,883,158 | B1 | 4/2005 | Sandstrom et al. |
| 7,269,470 | B2 * | 9/2007 | Kouno et al. ................ 700/109 |
| 2002/0013930 | A1 | 1/2002 | Inanami et al. |
| 2002/0046140 | A1 | 4/2002 | Kano et al. |
| 2003/0016341 | A1 | 1/2003 | Komine et al. |

FOREIGN PATENT DOCUMENTS

| | | |
|---|---|---|
| JP | 6-5488 | 1/1994 |
| JP | 7-134393 | 5/1995 |
| JP | 8-334888 | 12/1996 |
| JP | 9-34095 | 2/1997 |
| JP | 10-303124 | 11/1998 |
| JP | 11-102062 | 4/1999 |
| JP | 2001-85317 | 3/2001 |
| JP | 2002-132986 | 5/2002 |
| JP | 2002-184667 | 6/2002 |

OTHER PUBLICATIONS

Search Report issued by the Netherlands Patent Office, on Apr. 7, 2006, for Netherlands Application No. 135224.

Notice of Grounds for Rejection issued by the Taiwanese Patent Office, dated Feb. 20, 2006, for Taiwanese Patent Application No. 092121376, and English-language translation thereof.

Notice of Grounds for Rejection issued by the Japanese Patent Office, mailed Mar. 7, 2006, for Japanese Patent Application No. P2002-234053, and English-language translation thereof.

Notification of the Reasons for Refusal on the first examination, issued by the Chinese Patent Office in counterpart Chinese Application No. 03153202.0 and English translation of a remarks portion of that Notification.

U.S. Appl. No. 10/374,094, filed Feb. 27, 2003, to Nojima et al.

Van Den Brink et al., "Matching Management of Multiple Wafer Steppers Using a Stable Standard and a Matching Simulator," SPIE (1989), 1087:218-232.

* cited by examiner

US 7,546,178 B2

ALIGNER EVALUATION SYSTEM, ALIGNER EVALUATION METHOD, A COMPUTER PROGRAM PRODUCT, AND A METHOD FOR MANUFACTURING A SEMICONDUCTOR DEVICE

CROSS REFERENCE TO RELATED APPLICATIONS

This is a division of application Ser. No. 10/636,625, filed Aug. 8, 2003, now U.S. Pat. No. 7,269,470 which is incorporated herein by reference.

This application is based upon and claims the benefit of priority from the prior Japanese Patent Applications No. P2002-234053, filed on Aug. 9, 2002; the entire contents of which are incorporated herein by reference.

BACKGROUND OF THE INVENTION

1. Field of the Invention

The present invention relates to technology for manufacturing a semiconductor device, and, more particular, relates to an aligner evaluation system, an aligner evaluation method, an aligner evaluation program, and a method for manufacturing a semiconductor device used therein.

2. Description of the Related Art

A photolithography process is generally performed as a manufacturing process of semiconductor devices. Optical system errors attributable to aberration of a projection lens of an aligner used in the photolithography process and errors attributable to a difference in an illumination optical system represent unique values to each aligner. Accordingly, those errors vary delicately with aligners even of the same type. Therefore, if optimized exposure conditions for a new product in a particular aligner are applied to another aligner, it is possible that the latter aligner is not applicable to development of the new product (product development) because of inter-aligner variation in device pattern shapes formed on an exposure object, which is attributable to the optical system errors of each aligner. Accordingly, it is necessary to determine whether each aligner for performing the product development has an appropriate performance to facilitate the organization of a product development machine group.

Conventional device pattern simulation has been conducted without considering such optical system errors among the aligners. Accordingly, it has not been possible to determine from a group of aligners as to whether those aligners severally have appropriate performances for implementing an organization of a product development machine group for a new product. For this reason, conventionally, it has been necessary to carry out optimization of the exposure conditions for each of the aligners having delicately variable optical performances with respect to one another. Moreover, each of the aligners has been evaluated whether the aligner has the appropriate performances for implementing an organization of the product development machine group by a sequence of processes encompassing: exposure using a mask (reticle) for delineating device patterns of a product; development of the patterns; and measurement of shapes of the delineated patterns. As a consequence, product development has involved considerable time and effort.

SUMMARY OF THE INVENTION

A feature of the present invention inheres in a evaluation system including (a) an error calculation module configured to calculate error information on mutual optical system errors among plurality of aligners; (b) a simulation module configured to simulate device patterns to be delineated by each of the aligners based on the error information; and (c) an evaluation module configured to evaluate whether each of the aligners has appropriate performances for implementing an organization of a product development machine group based on the simulated device pattern.

Another feature of the present invention inheres in a evaluation method including (a) calculating error information on mutual optical system errors from among a plurality of aligners; (b) simulating device patterns to be delineated by each of the aligners based on the error information; and (c) evaluating whether each of the aligners has appropriate performances for implementing an organization of a product development machine group based on the simulated device pattern.

An additional feature of the present invention inheres in a computer program product for executing an application on an aligner evaluation system, the computer program product providing (a) instructions configured to calculate error information on mutual optical system errors of a plurality of aligners; (b) instructions configured to simulate device patterns to be delineated by each of the aligners based on the error information; and (c) instructions configured to evaluate whether each of the aligners has appropriate performances for implementing an organization of a product development machine group based on the simulated device pattern.

A further feature of the present invention inheres in a method for manufacturing a semiconductor device including (a) determining a layout of a device pattern; (b) producing a set of masks based on the determined layout; (c) calculating error information on mutual optical system errors of the plurality of aligners, simulating device patterns to be delineated by each of the aligners based on the error information, evaluating whether each of the aligners has appropriate performances for implementing an organization of a product development machine group based on the simulated device pattern; (d) coating a photoresist film on a semiconductor wafer; and (e) exposing the photoresist film with one of the masks employing the aligner evaluated to have the appropriate performances.

DETAILED DESCRIPTION OF THE INVENTION

Figure 1:
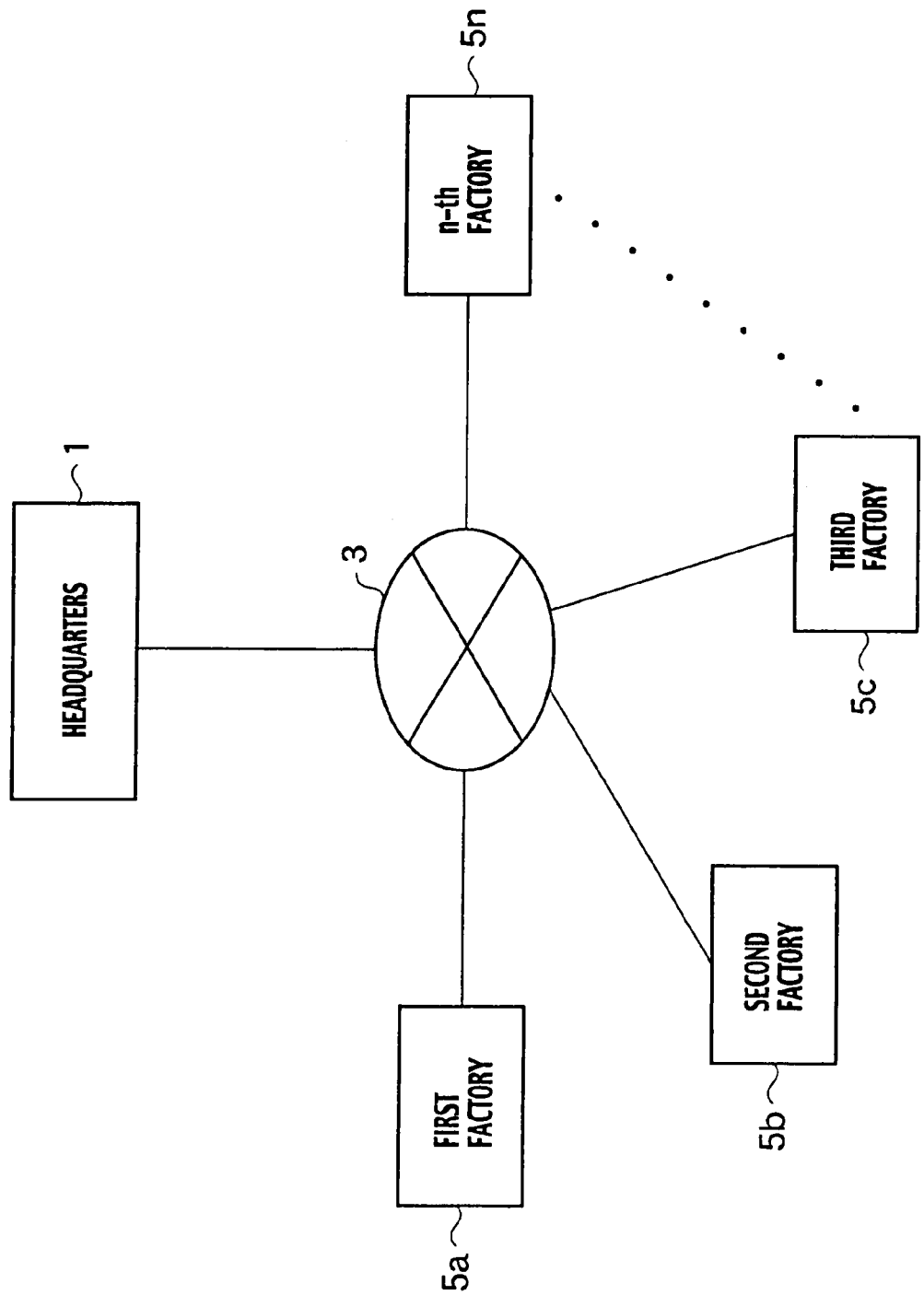
FIG. 1 is a block diagram showing the configuration of an aligner evaluation system according to an embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

In the following descriptions, numerous specific details are set fourth such as specific signal values, etc. to provide a thorough understanding of the present invention. However, it will be obvious to those skilled in the art that the present invention may be practiced without such specific details.

(Aligner Evaluation System)

Figure 2:
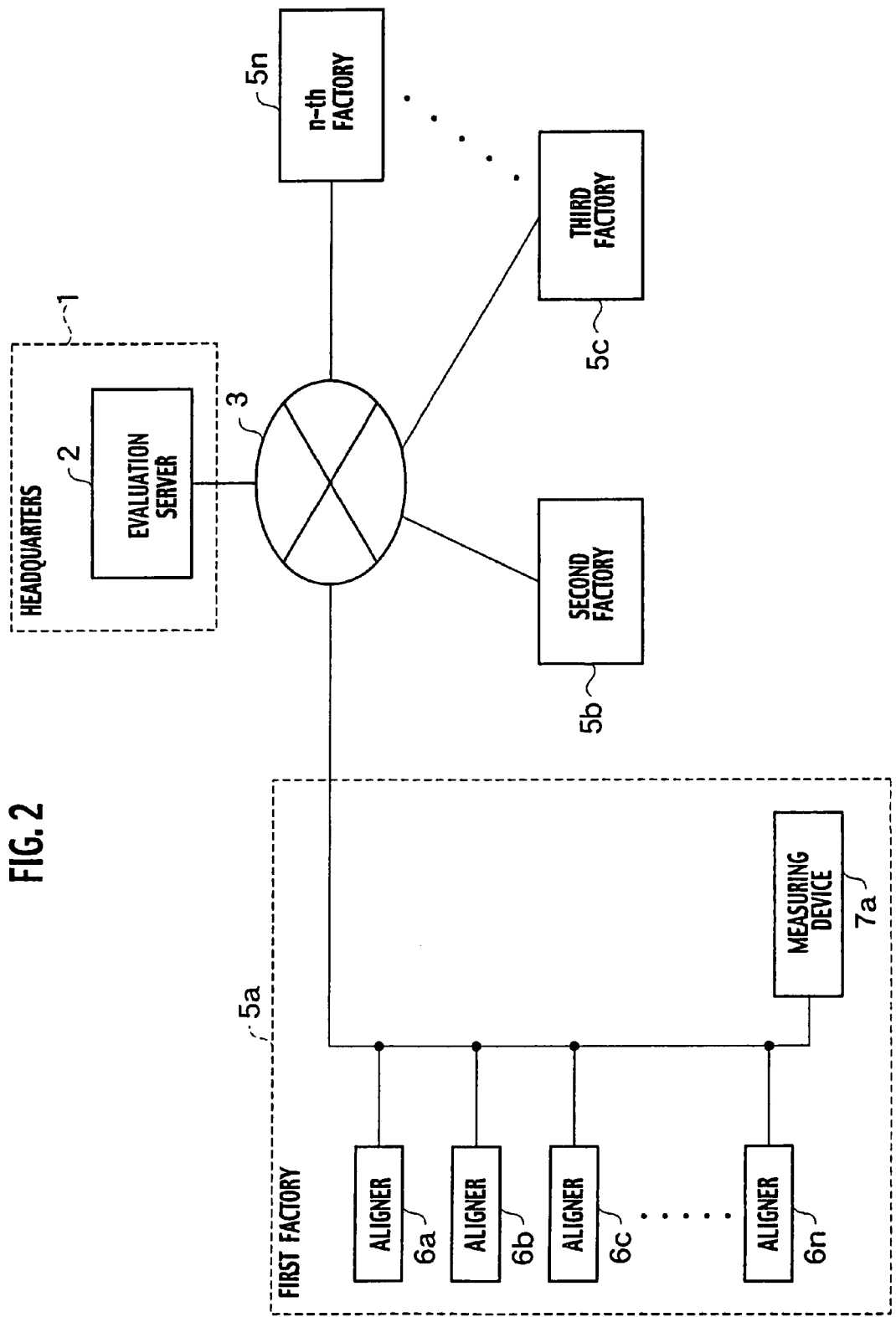
FIG. 2 is another block diagram showing the configuration of the aligner evaluation system according to the embodiment of the present invention.

As shown in FIG. 1, an aligner evaluation system according to an embodiment of the present invention includes a headquarters 1, and a plurality of (first to n-th) factories 5a, 5b, 5c, ..., and 5n which are connected to the headquarters 1 through a communication network 3. The Internet, an intranet and the like are applicable to the communication network 3. As shown in FIG. 2, an evaluation server 2 connected to the communication network 3 is located in the headquarters 1. Moreover, the first factory 5a includes a plurality of aligners 6a, 6b, 6c, ..., and 6n and a measuring device 7a, each of which is connected to the communication network 3. Similar to the first factory 5a, each of the second to n-th factories 5b, 5c, ..., and 5n includes a plurality of aligners and a measuring device. The evaluation server 2 is for managing the plurality of aligners and the measuring device located in each of the plurality of factories 5a to 5n by exchanging information written in the extensible markup language (XML) through the communication network 3.

In the following, for the purpose of simplification, description will be made regarding the case where the evaluation server 2 exchanges information with the plurality of aligners 6a to 6n and the measuring device 7a which are located in the first factory 5a.

Figure 3:
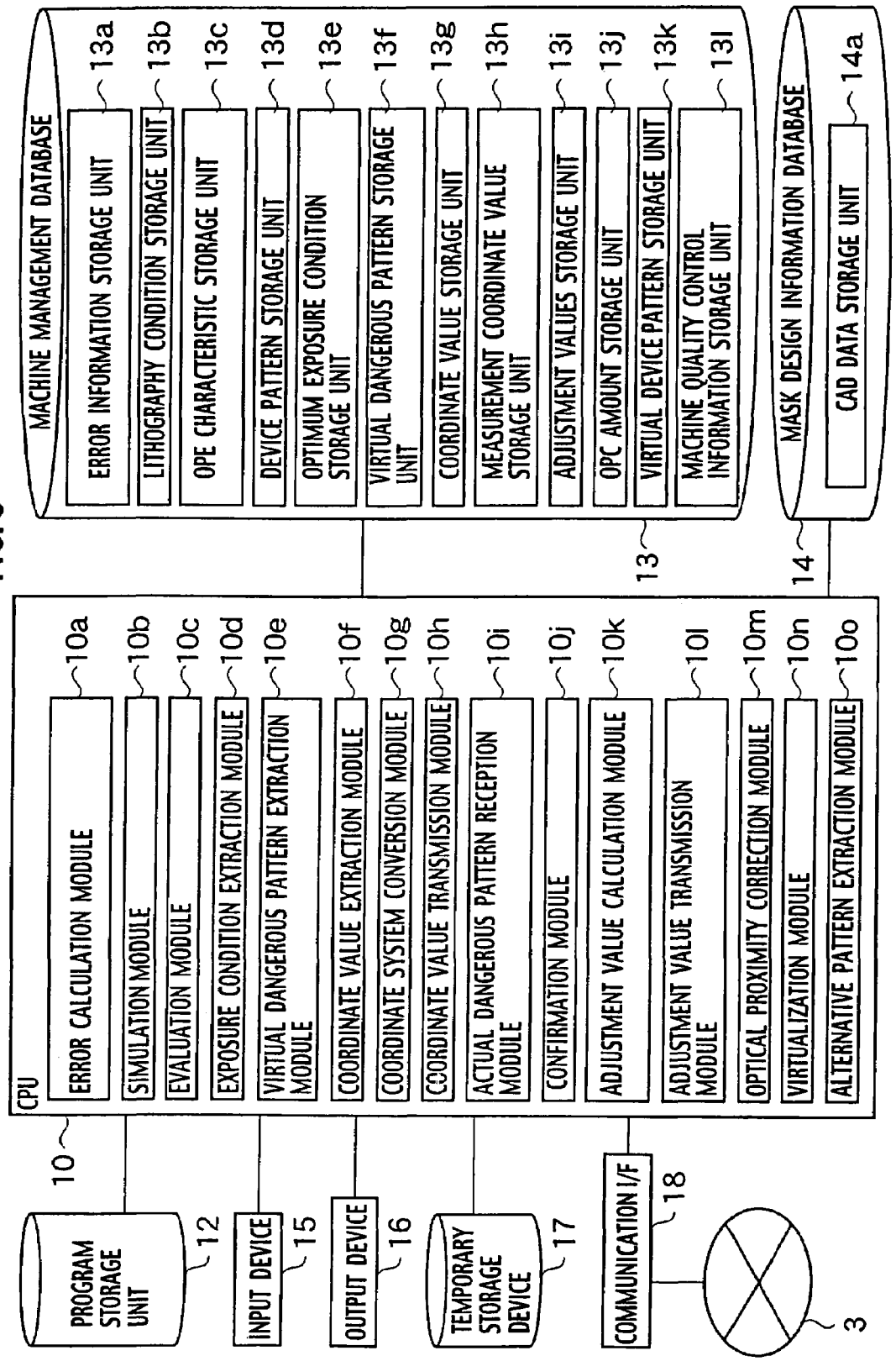
FIG. 3 is a block diagram showing the configuration of an evaluation server according to the embodiment of the present invention.

As shown in FIG. 3, the evaluation server 2 includes a central processing unit (CPU) 10, and a program storage unit 12, a machine management database 13, a mask design information database 14, an input device 15, an output device 16, a temporary storage device 17, a communication interface (communication I/F) 18 which are connected to the CPU 10.

The CPU 10 includes an error calculation module 10a, a simulation module 10b, a evaluation module 10c, an exposure condition extraction module 10d, a virtual dangerous pattern extraction module 10e, a coordinate value extraction module 10f, a coordinate system conversion module 10g, a coordinate value transmission module 10h, an actual dangerous pattern reception module 10i, a confirmation module 10j, an adjustment value calculation module 10k, an adjustment value transmission module 10l, a correction module 10m, a virtualization module 10n, and an alternative pattern extraction module 10o.

The error calculation module 10a calculates error information on mutual optical system errors from among the plurality of aligners 6a to 6n shown in FIG. 2. Here, the error information on the optical system errors pertains to information on errors attributable to differences in aberrations of the respective projection lenses, information on errors attributable to differences in illumination optical systems of the plurality of aligners 6a to 6n. The aberration of the projection lens includes wavefront aberrations such as spherical aberration, coma aberration, and astigmatism. The wavefront aberration can be expressed by use of the Zernike polynomials. The Zernike polynomials include Zernike coefficients of first to thirty-sixth terms. In ascending order starting from the first term, the respective Zernike coefficients represent aberration of higher degrees in a radial direction. The errors attributable to the differences in the aberration of the projection lenses are obtained by being converted into the Zernike coefficients. The errors attributable to the differences in the illumination optical systems include uneven illuminance, axial misalignment, variation of coherence factors σ of the illumination optical systems, and the like, which are calculated in quantitative values. The coherence factor σ of the illumination optical system is an index representing brightness of the illumination optical system. The coherence factor σ can be expressed as $\sigma = NA_1 / NA_2$ where $NA_1$ is a lens numerical aperture of the illumination optical system (a condenser lens) viewed from a mask side and $NA_2$ is a lens numerical aperture of a reducing projection lens viewed from the mask side. Light, which is obliquely incident on the mask, is increased as the coherence factor σ becomes larger, whereby light contrast on a wafer varies. The calculated information on the optical system errors is stored in an error information storage unit 13a of the machine management database 13.

The simulation module 10b simulates device patterns to be delineated on a wafer surface by exposure with masks for each of the aligners 6a to 6n, based on the error information on the optical system errors, machine quality control information (machine QC information), and lithography conditions which are respectively stored in the error information storage unit 13a, a machine quality control information storage unit 13l, and a lithography condition storage unit 13b of the machine management database 13, as well as on computer-aided design (CAD) data stored in a CAD data storage unit 14a of the mask design information database 14. The machine quality control information includes parameters, for each of the aligners 6a to 6n, such as the numerical aperture NA of the projection lens, the coherence factor σ of the illumination optical system, a ring-band ratio, and a focal depth (focus value). The lithography conditions include parameters, for each of the aligners 6a to 6n, such as an exposure amount (dose amount) and a mask bias (amount of displacement of the mask pattern from a designed value) determined based on the machine quality control information. A simulation result is stored in a device pattern storage unit 13d of the machine management database 13.

The evaluation module 10c evaluates whether each of the aligners 6a to 6n has appropriate performances for implementing an organization of the product development machine group, based on the simulation result stored in the device pattern storage unit 13d. To be more precise, the evaluation module 10c evaluates whether each of the device patterns simulated by the simulation module 10b satisfies design specifications. Moreover, the evaluation module 10c evaluates that the aligners, the device patterns of which have been evaluated to satisfy the design specifications, for example, the aligners 6a to 6f have the appropriate performance for implementing an organization of the product development machine group. Here, the design specifications are regulations including minimum pattern dimensions and minimum space dimensions of respective layers of a device, a relation of interlayer pattern positions, and the like. It is possible to produce a desired device when standard values of the design specifications are satisfied. Here, the standard values of the design specifications are determined appropriately depending on design guidelines of a new product.

The exposure condition extraction module 10d extracts exposure conditions such as exposure light intensity and exposure time which are most suitable for device patterns corresponding to the respective aligners 6a to 6n, based on the simulation result stored in the device pattern storage unit 13d, the machine quality control information stored in the machine quality control information storage unit 13l, and the like. The extracted exposure conditions are stored in an optimum exposure condition storage unit 13e of the machine management database 13.

The virtual dangerous pattern extraction module 10e extracts a pattern, as a "virtual dangerous pattern," which cannot or can barely achieve the desirable shapes due to small lithography latitude out of the simulated device patterns, based on the simulation result stored in the device pattern storage unit 13d. The extracted virtual dangerous pattern is stored in a virtual dangerous pattern storage unit 13f of the machine management database 13. Here, standard values for extraction of the virtual dangerous pattern are appropriately determined depending on design guidelines of each new product.

The coordinate value extraction module 10f extracts coordinate values of a mask pattern on a mask corresponding to the virtual dangerous pattern (such coordinate values will be hereinafter referred to as "dangerous pattern coordinate values") out of the CAD data stored in the CAD data storage unit 14a of the mask design information database 14. The extracted dangerous pattern coordinate values are stored in a coordinate value storage unit 13g of the machine management database 13. Moreover, the coordinate system conversion module 10g converts the dangerous pattern coordinate values stored in the coordinate value storage unit 13g into coordinate values suitable for the measuring device 7a shown in FIG. 2 (such coordinate values will be hereinafter referred to as "measurement coordinate values"). The measuring device 7a is for measuring pattern shapes of photoresist to be delineated on a wafer. When a scanning electron microscope (SEM) is used as the measuring device 7a, for example, a coordinate system of the dangerous pattern coordinate values is converted into a coordinate system of a scanning surface for scanning a wafer surface, and the measurement coordinate values are thereby obtained. The measurement coordinate values are stored in a measurement coordinate value storage unit 13h of the machine management database 13 shown in FIG. 3. The coordinate value transmission module 10h transmits the measurement coordinate values stored in the measurement coordinate value storage unit 13h to the measuring device 7a, shown in FIG. 2, connected with the communication I/F 18 through the communication network 3.

The actual dangerous pattern reception module 10i receives, through the communication network 3, a measurement result by the measuring device 7a concerning a shape of a photoresist pattern which is actually delineated by projection of the virtual dangerous pattern onto an exposure object (photoresist) by each of the aligners 6a to 6n (such a pattern will hereinafter be referred to as "actual dangerous pattern"). The confirmation module 10j compares the shape of the actual dangerous pattern of the photoresist received by the actual dangerous pattern reception module 10i with the shape of the virtual dangerous pattern stored in the virtual dangerous pattern storage unit 13f, and thereby confirms whether the shape of the actual dangerous pattern coincides with the shape of the virtual dangerous pattern.

The adjustment value calculation module 10k calculates an adjustment value for the projection lens of each of the aligners 6a to 6n, which is necessary for improvement in the device pattern to be projected on the photoresist film, based on the error information on the optical system errors stored in the error information storage unit 13a. The adjustment value transmission module 10l transmits, through the communication network 3, the adjustment values for the respective projection lenses calculated by the adjustment value calculation module 10k to error correction mechanisms 63a, 63b, 63c, . . . , and 63n which adjust the projection lenses of the corresponding aligners 6a, 6b, 6c, . . . , and 6n shown in FIG. 2.

The correction module 10m performs an optical proximity correction by updating parameters such as exposure amounts and mask biases for the respective mask patterns of the plurality of aligners 6a to 6n based on optical proximity correction (OPC) amounts stored in an OPC amount storage unit 13j of the machine management database 13. Optical proximity correction is a method for correcting an optical proximity effect (OPE), which represents deviation of the exposure conditions in the periphery of mutually adjacent patterns from the optimum values.

The virtualization module 10n simulates a plurality of virtual device patterns having different shapes from the device patterns simulated by the simulation module 10b. The alternative pattern extraction module 10o extracts an alternative pattern out of the plurality of virtual device patterns simulated by the virtualization module 10n instead of the virtual dangerous pattern. The alternative pattern has a different shape from the shape of the virtual dangerous pattern but has an identical function.

Furthermore, CPU 10 further includes a control module not shown. The control module controls input and output of the signals, and operation of the error calculation module 10a, the simulation module 10b, the evaluation module 10c, an exposure condition extraction module 10d, the virtual dangerous pattern extraction module 10e, the coordinate value extraction module 10f, the coordinate system conversion module 10g, the coordinate value transmission module 10h, the actual dangerous pattern reception module 10i, the confirmation module 10j, the adjustment value calculation module 10k, the adjustment value transmission module 10l, the correction module 10m, the virtualization module 10n, the alternative pattern extraction module 10o, the program storage unit 12, the machine management database 13, the mask design information database 14, the input device 15, the output device 16, the temporary storage device 17, the communication I/F 18 shown in FIG. 3, and, the aligners 6a-6n and the measuring device 7a.

In consideration of the load of the CPU 10, the functions provided by the CPU 10, i.e., the error calculation module 10a, the simulation module 10b, the evaluation module 10c, the exposure condition extraction module 10d, the virtual dangerous pattern extraction module 10e, the coordinate value extraction module 10f, the coordinate system conversion module 10g, the coordinate value transmission module 10h, the actual dangerous pattern reception module 10i, the confirmation module 10j, the adjustment value calculation module 10k, the adjustment value transmission module 10l, the correction module 10m, the virtualization module 10n, and the alternative pattern extraction module 10o may be distributed to a plurality of computers. When the functions are distributing to a plurality of computers, communication modules, such as a Local Area Network (LAN) and a telephone line, may connect each of the computers so that information can be mutually output and input.

The program storage unit 12 storages the program performed in the CPU 10 (the details of the program are described later.). As the program storage unit 12, for example a recording medium, which can record programs, such as a semiconductor memory, a magnetic disk, an optical disc, a magneto-optical disc and magnetic tape, can be used. Specifically, a flexible disk, a CD-ROM, an MO disk, a cassette tape and an open reel tape, etc. can be used.

The machine management database 13 includes the error information storage unit 13a for storing the error information on a optical system error, the lithography condition storage unit 13b for storing lithography conditions, an OPE characteristic storage unit 13c for storing the optical proximity effect characteristic, the device pattern storage unit 13d for storing the simulation result of device patterns, the optimal exposure condition storage unit 13e for storing the optimal exposure conditions for the virtual dangerous patterns, the virtual dangerous pattern storage unit 13f for storing the virtual dangerous patterns, the coordinates value storage unit 13g for storing the dangerous pattern coordinates value, the measurement coordinates value storage unit 13h for storing the measurement coordinates value, an adjustment value storage unit 13i for storing the adjustment value of the projection lens, and the OPC amount storage unit 13j for storing optical proximity correction amount, a virtual device pattern storage unit 13k for storing the virtual device pattern, the machine quality control information storage unit 13l for storing the machine quality control information. Moreover, The optical proximity correction amount stored in the OPC amount storage unit 13j can be provided by device simulation for mask designing etc.

The mask design information database 14 includes a CAD data storage unit 14a for storing the CAD data used in case a mask is designed. The temporary storage unit 17 includes a random-access memory (RAM), etc. The RAM stores the information used during program execution of the aligner evaluation program in CPU 10, and functions as an information memory used as a work domain. As the input device 15, for example, a keyboard, a mouse, a voice device, etc. can be used. The output device 16 is applicable to a liquid crystal display (LCD), a CRT display, a printer, and the like.

Figure 4:
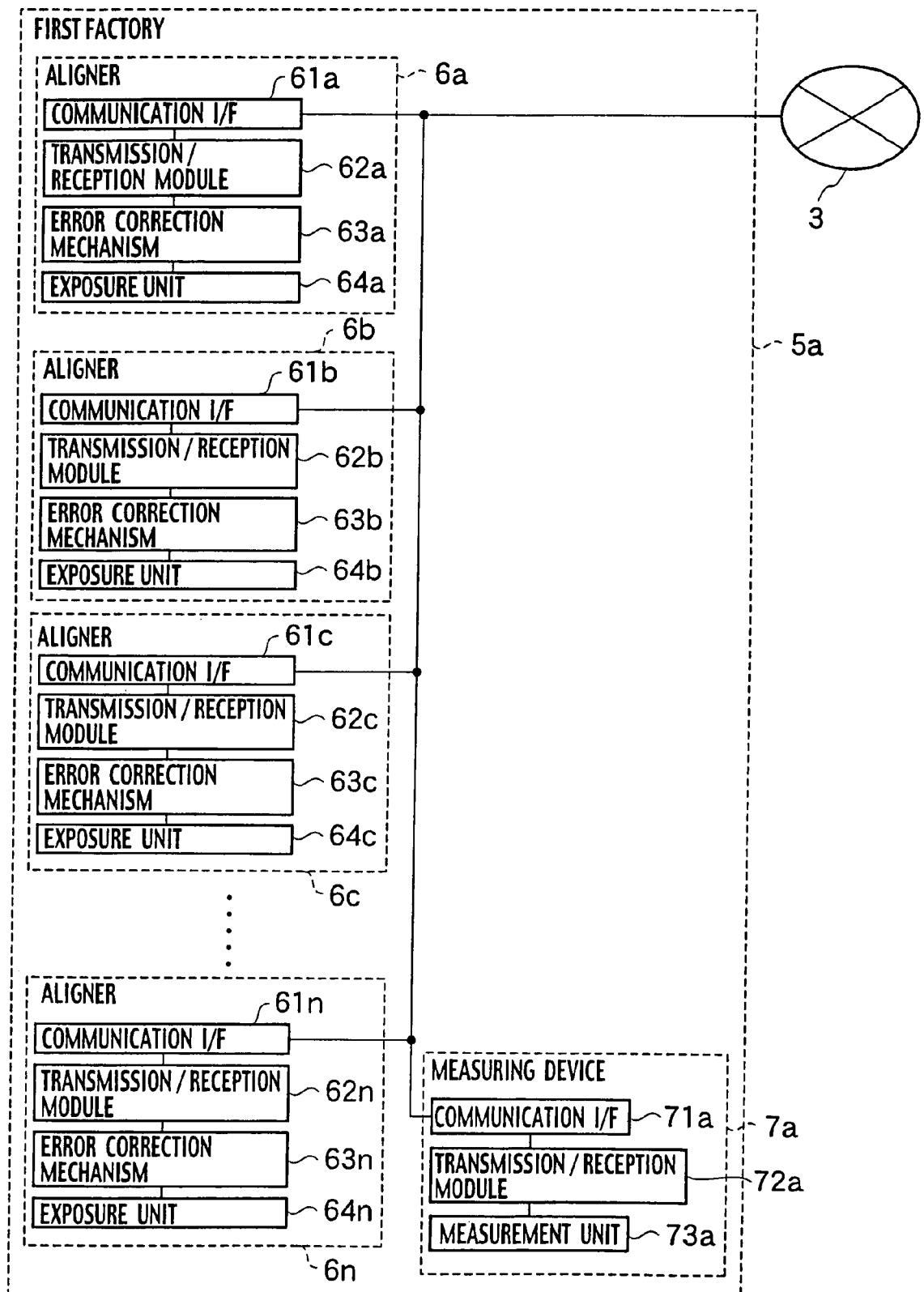
FIG. 4 is a block diagram showing the configuration of a first factory according to the embodiment of the present invention.

As shown in FIG. 4, each of the aligners 6a, 6b, 6c, ..., and 6n of the first factory 5a include communication I/Fs 61a, 61b, 61c, ..., and 61n connected to the communication network 3, transmission/reception modules 62a, 62b, 62c, ..., and 62n for transmitting and receiving information to and from the evaluation server 2, the error correction mechanisms 63a, 63b, 63c, ..., and 63n for receiving signals from the evaluation server 2, and exposure units 64a, 64b, 64c, ..., and 64n for performing exposure by use of masks. Reduction projection aligners such as steppers or scanners, and the like can be provided as the aligners 6a to 6n. The measuring device 7a in the first factory 5a includes a communication I/F 71a connected to the communication network 3, a transmission/reception module 72a connected to the communication I/F 71a, a measurement unit 73a connected to the transmission/reception module 72a. The transmission/reception module 72a receives measurement instruction information from the evaluation server 2 and transmits a measurement result thereto through the communication I/F 71a. The measurement unit 73a measures shapes of patterns and the like. A SEM or a laser microscope, for example, may be applied as the measuring device 7a.

(Aligner Evaluation Method)

Figure 5:
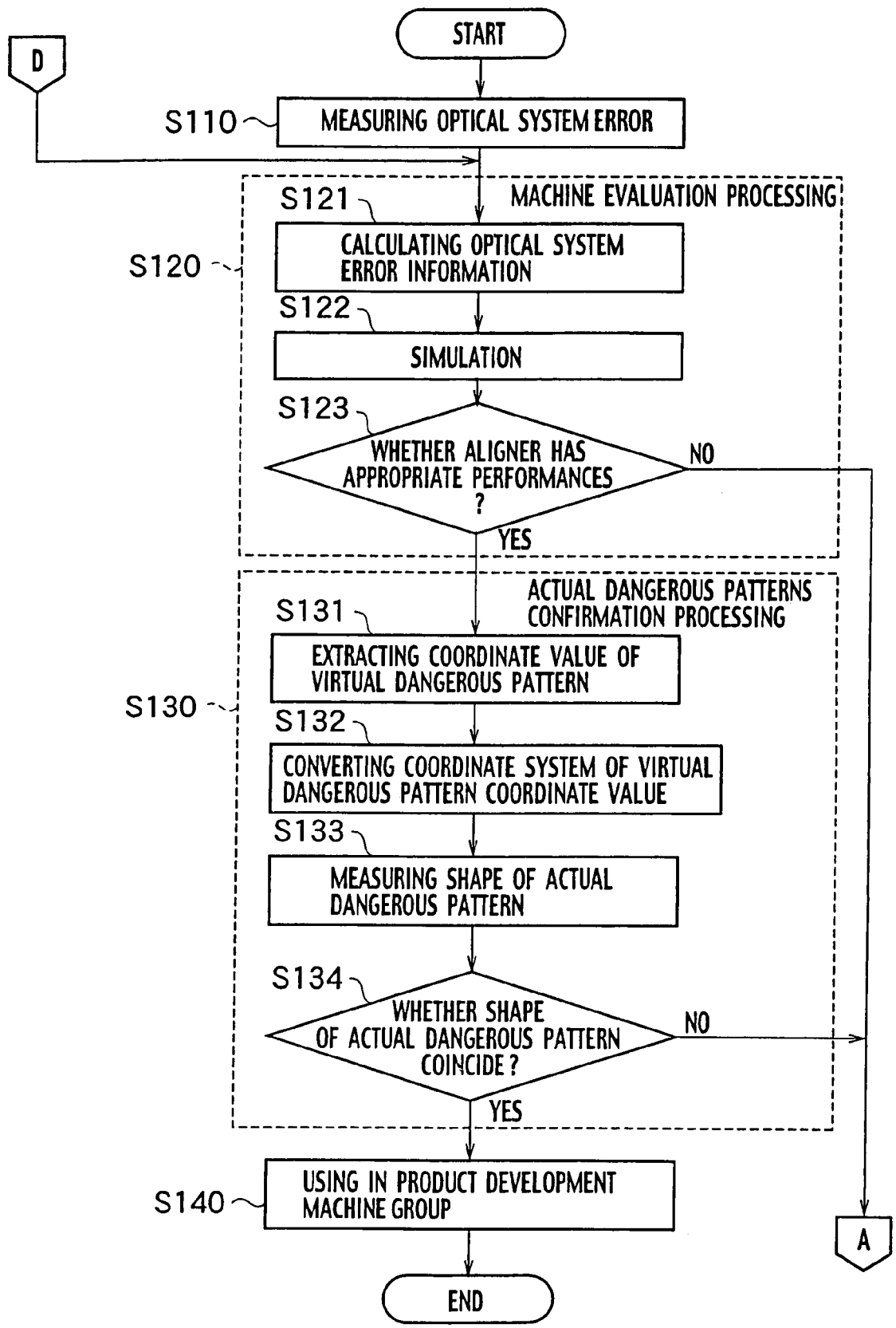
FIG. 5 is a flowchart for explaining an aligner evaluation method according to the embodiment of the present invention.
Figure 6:
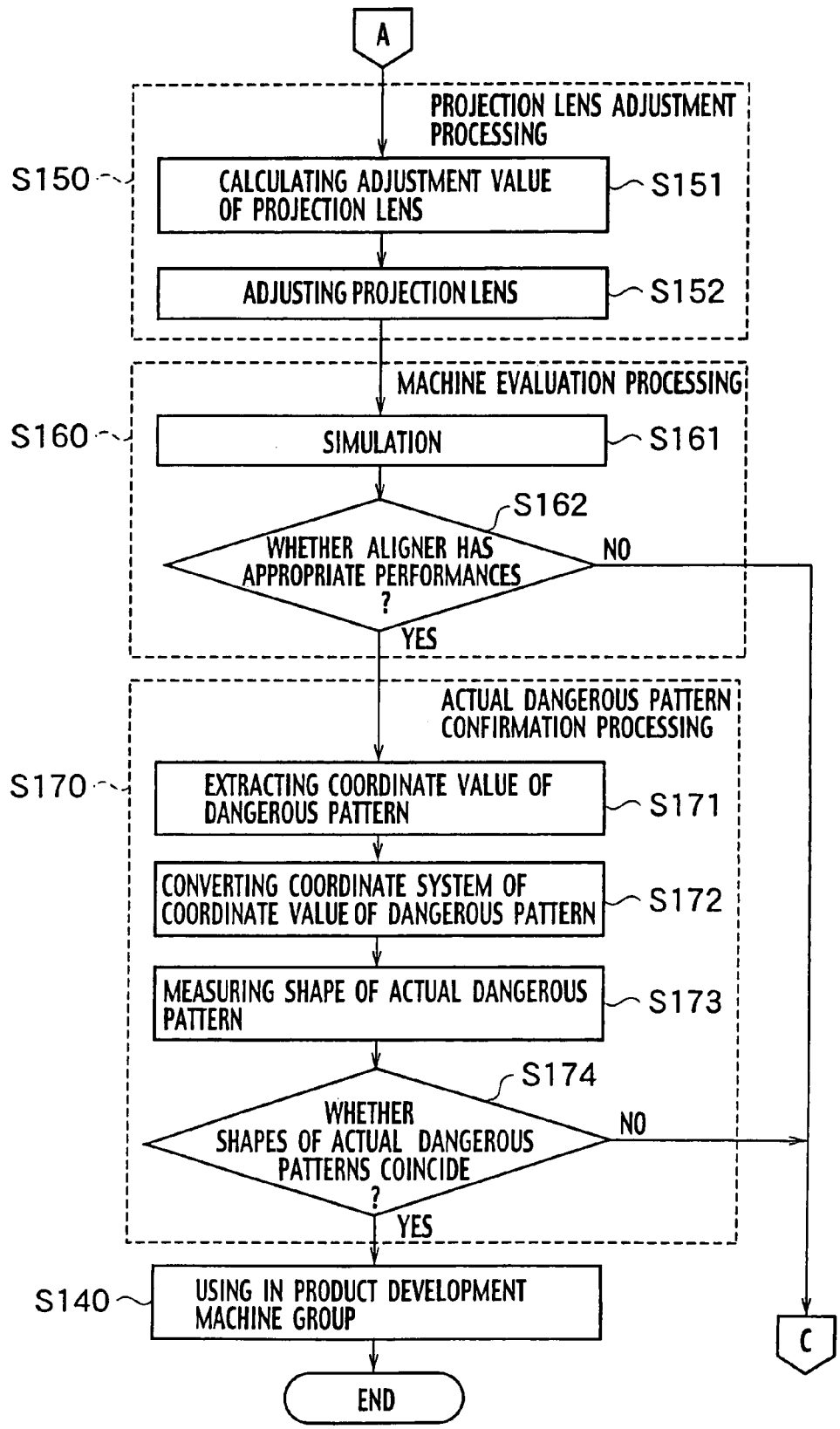
FIG. 6 is another flowchart for explaining the aligner evaluation method according to the embodiment of the present invention.
Figure 7:
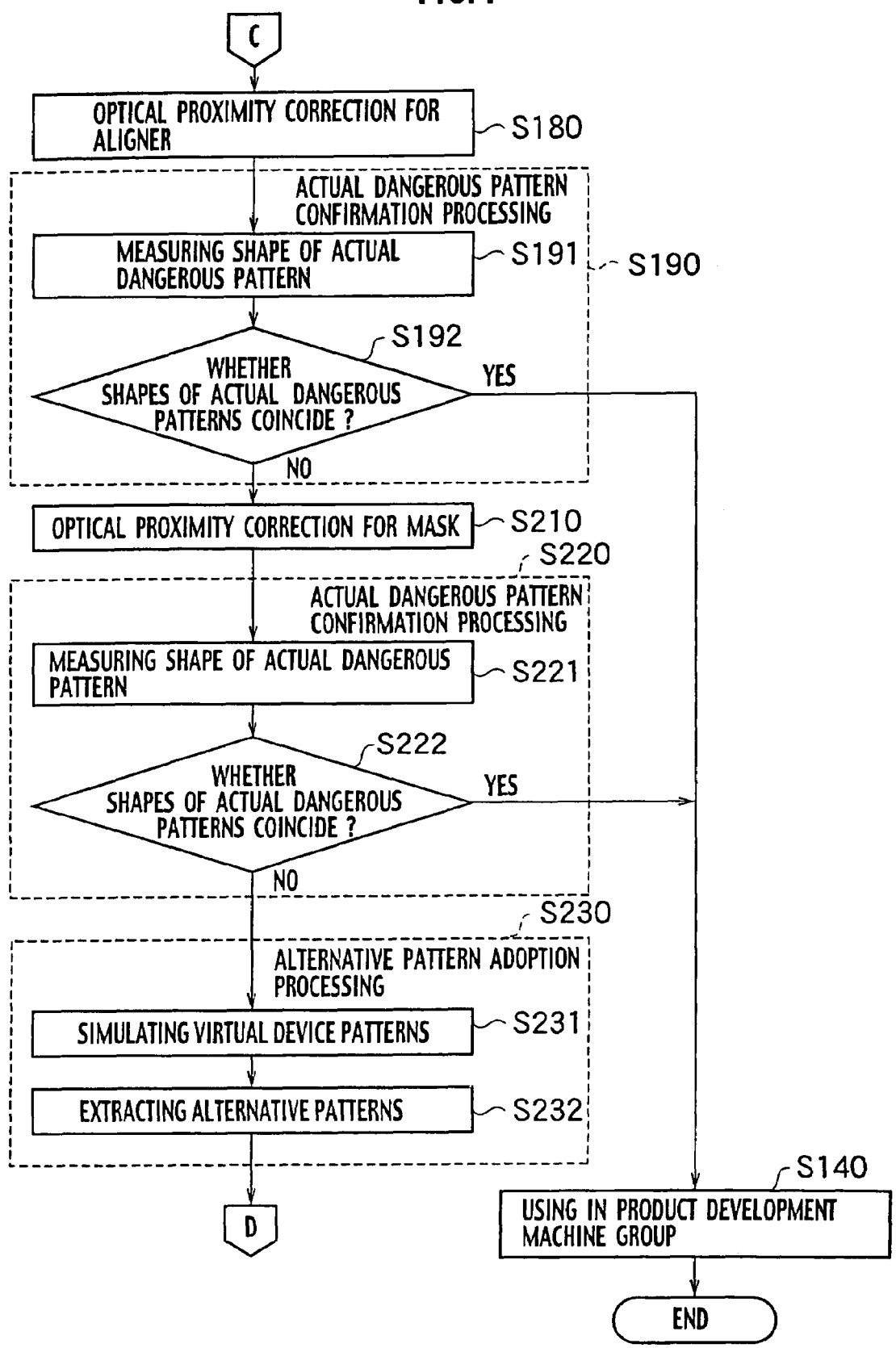
FIG. 7 is an additional flowchart for explaining the aligner evaluation method according to the embodiment of the present invention.

Next, description will be made regarding an aligner evaluation method according to the embodiment of the present invention with reference to flowcharts of FIG. 5 to FIG. 7. For the purpose of simplification, description will be made below regarding the plurality of aligners 6a to 6n and the measuring device 7a in the first factory 5a shown in FIG. 2, as an example. However, it is needless to say that similar processing may also actually take place in a global system including a larger group of aligners and a larger group of measuring devices such as the aligners and the measuring devices located in the second to n-th factories 5b to 5n.

(A) In Step S110, photoresist film coated on wafer surfaces is subjected to exposure through masks having test patterns for aberration measurement by use of the plurality of aligners 6a to 6n shown in FIG. 2 and FIG. 4, which are expected to be used to the product development. The photoresist film is then developed and photoresist evaluation patterns for aberration measurement are delineated on the wafer surfaces. Thereafter, each of the shapes of the photoresist evaluation patterns provided by the respective aligners 6a to 6n is actually measured by use of the measuring device 7a such as an SEM. Then, the measurement results of the shapes of the evaluation patterns by the measuring device 7a are transmitted to the error calculation module 10a of the evaluation server 2 shown in FIG. 3 through the communication network 3.

(B) In Step S120, machine evaluation processing for evaluating whether the plurality of aligners 6a to 6n have the appropriate performance for implementing an organization of the product development machine group is performed in accordance with procedures (a) to (c) as described below.

(a) In Step S121, the error calculation module 10a calculates the information on the errors attributable to differences in aberration of the projection lenses, the information on the errors attributable to differences in the illumination optical systems, and the like, as the optical system error information among the plurality of aligners 6a to 6n, based on the measurement results of the photoresist evaluation patterns received from the measuring device 7a. The information on the errors attributable to differences in aberration of the projection lenses is calculated by conversion into the Zernike coefficients. The information on the errors attributable to differences in the illumination optical systems is quantitatively calculated as the values of uneven illuminance, axial misalignment, variation of coherence factors σ of the illumination optical systems, and the like. The calculated optical system error information is stored in the error information storage unit 13a.

(b) In Step S122, the simulation module 10b simulates the device patterns to be delineated by the respective aligners 6a to 6n, based on the optical system error information, the lithography conditions, the machine quality control information, the CAD data, and the like, which are obtained from the error information storage unit 13a, the lithography condition storage unit 13b, the machine quality control information storage unit 13l, and the CAD data storage unit 14a, respectively. Here, the machine quality control information includes the numerical apertures NA of the projection lenses of the respective aligners 6a to 6n, the coherence factors σ of the illumination optical systems, the ring-band ratios, the focal depths, and the like. The lithography conditions include the exposure amounts, the mask biases, and the like. The simulation results of the device patterns are stored in the device pattern storage unit 13d.

(c) In Step S123, the evaluation module 10c evaluates whether each of the aligners 6a to 6n has the appropriate performances for implementing the organization of the product development machine group, based on the simulation results stored in the device pattern storage unit 13d. To be more specific, the evaluation module 10c evaluates whether each device pattern simulated by the simulation module 10b satisfies the design specifications. Then, the aligners, the device patterns of which are evaluated to satisfy the design specifications, for example, the aligners 6a to 6f are evaluated to have the appropriate performances for implementing the organization of the product development machine group. Regarding the aligners 6a to 6f, which are evaluated to have the appropriate performances for implementing the organization of the product development machine group by the evaluation module 10c in Step S123, the procedure advances to Step S130, where actual dangerous pattern confirmation processing takes place. On the other hand, regarding the aligners which are evaluated not to have the appropriate performances for implementing the organization of the product development machine group from among the plurality of aligners 6a to 6n, for example, the aligners 6g to 6n, the procedure advances to Step S150, where projection lens adjustment processing takes place. Moreover, in Step S123, the exposure condition extraction module 10d extracts the respective optimum exposure conditions for the device patterns corresponding to the aligners 6a to 6n, based on the simulation results of the device patterns stored in the device pattern storage unit 13d, the machine quality control information stored in the machine quality control information storage unit 13l, and the like. The optimum exposure conditions to be extracted include the parameters such as the exposure amounts and the mask biases. The extracted optimum exposure conditions are stored in the optimum exposure condition storage unit 13e.

(C) In Step S130, regarding the aligners 6a to 6f, which are evaluated to have the appropriate performances for implementing the organization of the product development machine group in the machine evaluation processing in Step S120, the actual dangerous pattern confirmation processing for confirming whether the shapes of the actual dangerous patterns coincide with the shapes of the virtual dangerous patterns is performed in accordance with the procedures (a) to (d) described below.

(a) In Step S131, the virtual dangerous pattern extraction module 10e shown in FIG. 3 extracts the virtual dangerous pattern out of the plurality of simulated device patterns based on the simulation results stored in the device pattern storage unit 13d. The extracted virtual dangerous pattern is stored in the virtual dangerous pattern storage unit 13f. The coordinate value extraction module 10f then extracts the dangerous pattern coordinate values corresponding to the virtual dangerous pattern stored in the virtual dangerous pattern storage unit 13f, out of the CAD data stored in the CAD data storage unit 14a. The extracted dangerous pattern coordinate values are stored in the coordinate value storage unit 13g. Here, the dangerous pattern coordinate values are values expressed in a CAD coordinate system.

(b) In Step S132, the coordinate system conversion module 10g converts the coordinate system of the dangerous pattern coordinate values stored in the coordinate value storage unit 13g into a coordinate system suitable for the measuring device 7a, and thereby determines the measurement coordinate values. The measurement coordinate values are stored in the measurement coordinate value storage unit 13h. Next, the coordinate value transmission module 10h transmits the measurement coordinate values stored in the measurement coordinate value storage unit 13h to the measuring device 7a through the communication I/F 18 and though the communication network 3 shown in FIG. 2.

(c) In Step S133, the exposure object (photoresist) on the wafer is exposed by projecting the virtual dangerous pattern under the optimum conditions for each of the aligners 6a to 6n, and then the exposure object is developed to delinate the actual dangerous pattern of the photoresist. Here, it is also possible to selectively etch a thin film on a lower layer using the photoresist as a mask, and to use the thin-film pattern on the lower layer as the actual dangerous pattern. Nevertheless, description will be given below regarding the case of using the photoresist pattern as the actual dangerous pattern. Thereafter, the wafer having the actual dangerous patterns formed thereon is set on the measuring device 7a, whereby the shapes of the actual dangerous patterns are actually measured by use of the measuring device 7a while adopting the measurement coordinate values received from the coordinate value transmission module 10h as measurement positions. The measurement results of the shapes of the actual dangerous patterns are transmitted to the actual dangerous pattern reception module 10i by the transmission/reception module 72a through the communication network 3.

(d) In Step S134, the confirmation module 10j compares the shapes of the actual dangerous patterns received by the actual dangerous pattern reception module 10i with the shapes of the dangerous patterns stored in the virtual dangerous pattern storage unit 13f, and thereby determines whether the shapes of the actual dangerous patterns coincide with the shapes of the virtual dangerous patterns for each of the aligners 6a to 6f. Among the aligners 6a to 6f, the aligners, which delineates the shapes of the actual dangerous patterns, confirmed as coincident with the shapes of the virtual dangerous patterns, for example, the aligners 6a to 6c may be used in the product development machine group in Step S140. On the other hand, the aligners which delineates the shapes of the actual dangerous patterns which do not coincide with the shapes of the virtual dangerous patterns in Step S134 due to deviation caused by influences attributable to the optical system errors and the like, for example, the aligners 6d to 6f are subjected to the projection lens adjustment processing in Step S150 shown in FIG. 6.

(D) In Step S150, the projection lens adjustment processing for adjusting each of the projection lenses of the aligners 6d to 6n in accordance with the following Steps S151 and S152. In Step S151, the adjustment value calculation module 10k calculates the adjustment values for the projection lenses necessary for improving the device patterns to be projected on the photoresist, for the respective aligners 6d to 6n, based on the optical system error information stored in the error information storage unit 13a. In Step S152, the adjustment value transmission module 10l transmits the adjustment values for the projection lenses to the corresponding respective error correction mechanisms 63d to 63n of the aligners 6d to 6n through the communication network 3. The error correction mechanisms 63d to 63n then adjust the respective projection lenses of the aligners 6d to 6n based on the received adjustment values for the projection lenses.

(E) In Step S160, machine evaluation processing is performed in accordance with the following Steps S161 and S162, regarding the aligners 6d to 6n after adjustment of the projection lenses. In Step S161, the simulation module 10b simulates device patterns to be delineated by the respective aligners 6d to 6n with the adjusted projection lenses, based on the optical system error information stored in the error information storage unit 13a, the adjustment values for the projection lenses stored in the projection lens adjustment values storage unit 13i, and the like. The simulation results are stored in the device pattern storage unit 13d, and the previously stored simulation results are thereby updated. In Step S162, the evaluation module 10c evaluates whether the simulated design pattern of each of the aligners 6d to 6n after adjustment of the projection lenses satisfies the design specifications, i.e. whether each of the aligners 6d to 6n has the appropriate performances for implementing the organization of the product development machine group, based on the simulation results stored in the device pattern storage unit 13d. In Step S162, among the aligners 6d to 6n, the aligners which are evaluated to have the appropriate performances, for example, the aligners 6d to 6i are subjected to actual dangerous pattern confirmation processing in Step S170. On the other hand, the aligners which are evaluated not to have the appropriate performance, for example, the aligners 6j to 6n advance to Step S180.

(F) In Step S170, the aligners 6d to 6i with the adjusted projection lenses are subjected again to the actual dangerous pattern confirmation processing in accordance with the following Steps S171 to S174. In Step S171, the virtual dangerous pattern extraction module 10e extracts the virtual dangerous pattern out of the simulated device patterns, based on the simulation results stored in the device pattern storage unit 13d. Meanwhile, the coordinate value extraction module 10f extracts the dangerous pattern coordinate values. In Step S172, the coordinate system conversion module 10g converts the coordination system of the dangerous pattern coordinate values into the coordinate system suitable for the measuring device 7a, and thereby determines measurement coordinate values. The coordinate value transmission module 10h transmits the measurement coordinate values to the measuring device 7a. In Step S173, the measuring device 7a actually measures shapes of actual dangerous patterns delineated by projecting the virtual dangerous patterns on the exposure objects with the respective aligners 6d to 6i after adjustment of the projection lenses, while setting the measurement coordinate values as the measurement positions. The procedure in Step S173 is different from the procedure in Step 113 in that the aligners 6d to 6i with the adjusted projection lenses are used in Step S173. The measurement results of the shapes of the actual dangerous patterns by the measuring device 7a are transmitted to the actual dangerous pattern reception module 10i through the communication network 3. The confirmation module 10j compares the shapes of the virtual dangerous patterns stored in the virtual dangerous pattern storage unit 13f with the shapes of the actual dangerous patterns received by the actual dangerous pattern reception unit 10i, and thereby confirm whether the shapes of the actual dangerous patterns coincide with the shapes of the dangerous patterns. In Step S174, among the aligners 6d to 6i, the aligners which delineated the shapes of the actual dangerous patterns confirmed as coincident with the shapes of the virtual dangerous patterns, for example, the aligners 6d to 6f may be used in the product development machine group in Step S140. On the other hand, the aligners which delineated the shapes of the actual dangerous patterns which do not coincide with the shapes of the virtual dangerous patterns, for example, the aligners 6g to 6n advance to Step S180.

(G) In Step S180, optical proximity correction processing takes place for performing optical proximity correction of the aligners 6g to 6n. The correction module 10m updates the parameters such as the exposure amounts and mask biases out of the exposure conditions stored in the optimum exposure condition storage unit 13e, based on the optical proximity correction amounts stored in the OPC amount storage unit 13j, so as to improve the shapes of the actual dangerous patterns. In this way, the optical proximity correction is achieved. Alternatively, it is also possible to correct the numerical apertures NA of the projection lenses of the aligners 6g to 6n, or the coherence factors σ of the illumination optical systems.

(H) In Step S190, the actual dangerous pattern confirmation processing takes place again in accordance with the following Steps S191 and S192. First, the photoresist on the wafers is subjected to exposure under the exposure conditions after the optical proximity correction by use of the aligners 6g to 6n. The photoresist is then developed and the device patterns are thereby delineated. Thereafter, in Step S191, the measuring device 7a actually measures the shapes of the actual dangerous patterns out of the delineated device patterns. The confirmation module 10j confirms whether the shapes of the actual dangerous patterns coincide with the shapes of the virtual dangerous patterns. In Step S192, among the aligners 6g to 6n, the aligners which delineate the shapes of the actual dangerous patterns confirmed as coincident with the shapes of the virtual dangerous patterns, for example, the aligners 6g to 6i may be used in the product development machine group in Step S140. On the other hand, the aligners which delineate the shapes of the actual dangerous patterns which do not coincide with the shapes of the virtual dangerous patterns, for example, the aligners 6j to 6n advance to Step S210.

(I) In Step S210, the masks are subjected to optical proximity correction. In other words, "optical proximity corrected masks" are ordered and fabricated such that dimensions of mask patterns on the masks are modified to achieve the optical proximity amounts which are suitable for the respective aligners 6j to 6n. The optical proximity corrected masks may be contracted out and fabricated by an outside supplier, or may be fabricated at each of the factories 5a to 5n and the like. Thereafter, the newly fabricated optical proximity corrected masks are placed on the aligners 6j to 6n.

(J) In Step S220, the actual dangerous pattern confirmation processing takes place again by use of the following Steps S221 and S222. First, the photoresist on the wafers is subjected to exposure with the optical proximity corrected masks by use of the aligners 6j to 6n. Then, the photoresist is developed and the device patterns are thereby delineated. Thereafter, the measuring device 7a actually measures the shapes of the actual dangerous patterns out of the delineated device patterns. In Step S221, the confirmation module 10j confirms whether the shapes of the actual dangerous patterns coincide with the shapes of the virtual dangerous patterns. In Step S222, among the aligners 6j to 6n, the aligners which delineate the shapes of the actual dangerous patterns confirmed as coincident with the shapes of the virtual dangerous patterns, for example, the aligners 6j to 6l may be used in the product development machine group when the suitable optical proximity corrected mask is placed on an aligner, in Step S140. On the other hand, the aligners which delineate the shapes of the actual dangerous patterns which do not coincide with the shapes of the virtual dangerous patterns, for example, the aligners 6m to 6n advance to Step S230.

(K) In Step S230, alternative pattern adoption processing for examining modification of the design rules of the masks takes place by use of the following Steps S231 and S232. In Step S231, the virtualization module 10n simulates a plurality of virtual device patterns which are different from the device patterns simulated by the simulation module 10b. In Step S232, the alternative pattern extraction module 10o extracts a pattern, as an "alternative pattern", which has a different shape from the shape of the virtual dangerous pattern not coincident with the actual dangerous pattern in Step S220 but has the identical function thereto. For example, when the shape of a virtual dangerous pattern of two lines does not coincide with the shape of the actual dangerous pattern in Step S220, a pattern of three lines having the identical function as that of the virtual dangerous pattern of the two lines, or the like is extracted as the alternative pattern by the alternative pattern extraction module 10o. The extracted alternative pattern is stored in the virtual device pattern storage unit 13k. Thereafter, the alternative pattern extracted instead of the simulated dangerous pattern is adopted to fabricate an "alternative mask" having a different shape from the initial mask but having the identical function by use of a pattern generator, or the like, such as an electron beam (EB) aligner. The alternative mask may be fabricated by the factories 5a to 5n and the like, or fabricated by an outside supplier. Thereafter, returning to the machine evaluation processing in Step S120, a series of processing including the machine evaluation processing for the product development machine, the actual dangerous pattern confirmation processing, and so on is repeated on each of the aligners 6m to 6n equipped with the suitable alternative masks. When the procedure advances to Step S140, the aligner equipped with the suitable alternative mask, for example, the aligner m may be used in the product development machine group. On the other hand, a series of processing including the alternative pattern adoption processing, the machine evaluation processing, and so on is repeated on the aligner which advances to Step 142 again, for example, the aligner 6n.

According to the aligner evaluation method of the embodiment of the present invention, it is possible to promptly, easily, and collectively evaluate a plurality of aligners 6a to 6n with slightly different optical performances as to whether the aligners have the appropriate performances for implementing the organization of the product development machine group, and to use the appropriate aligners to the product development (mass production).

Note that the aligner evaluating process may be terminated depending on an arbitrary time period or on the number of repeated times of the series of processing, and the aligner evaluated as inapplicable to the product development machine group at the point of termination, for example, the aligner 6n may be excluded from the product development machine group.

(Projection Lens Adjustment Processing Modification—1)

Figure 8:
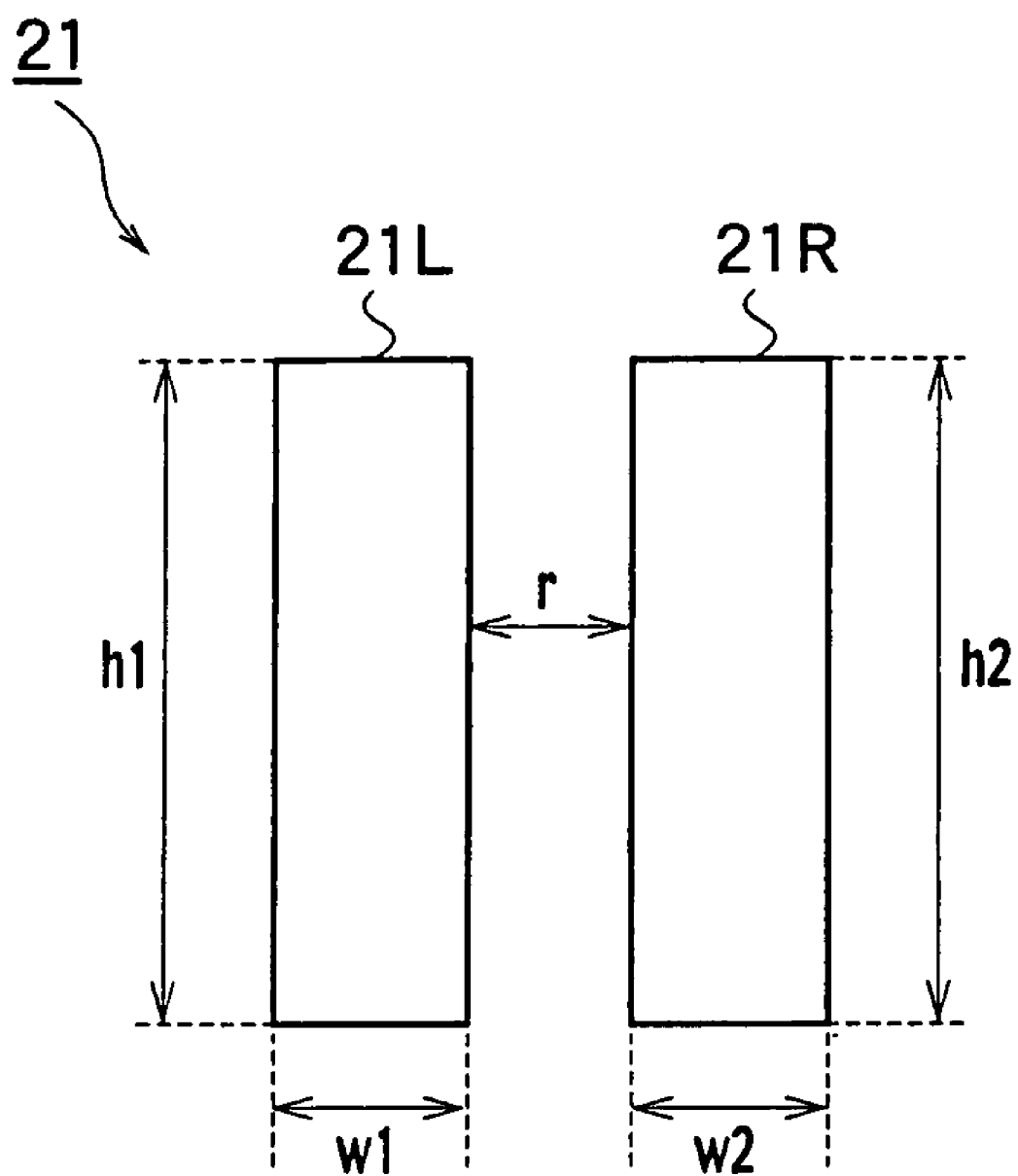
FIG. 8 is a plane view showing a first pattern according to a first projection lens adjustment processing modification.
Figure 9:
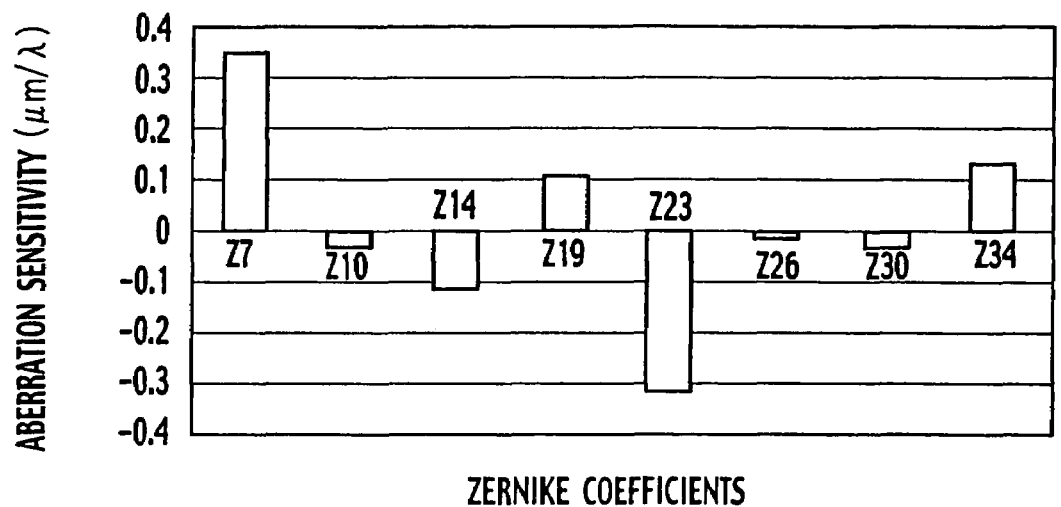
FIG. 9 is a graph showing sensitivity of the first pattern corresponding to Zernike coefficients according to the first projection lens adjustment processing modification.

Description will be made below regarding one example of the projection lens adjustment processing in Step S150. First, description will be made regarding the case of adjusting the projection lens of the aligner 6a while the mask has the pattern for delineating a first pattern 21 shown in FIG. 8. The first pattern 21 includes a set of a left pattern 21L and a right pattern 21R having mutually identical shapes. The two patterns 21L and 21R have image widths w1 and w2, and image heights h1 and h2, which are mutually of the same dimensions. The two patterns 21L and 21R are disposed in positions with an interval r therebetween. In Step S121, the error calculation module 10a calculates sensitivity of the first pattern 21 with respect to the Zernike coefficients shown in FIG. 9, as the optical system error information. The lateral axis of FIG. 9 represents the Zernike coefficients, and the longitudinal axis thereof represents the sensitivity of the first pattern 21. As shown in FIG. 9, the first pattern 21 is sensitive to the seventh term (Z7), the fourteenth term (Z14), and the twenty-third term (Z23) of the Zernike coefficients showing the wavefront aberration in the Zernike polynomials.

The projection lens adjustment calculation module 10k calculates the adjustment values for the projection lens based on the optical system error information, such that the adjustment values reduce the aberration corresponding to the seventh term, the fourteenth term, and the twenty-third term of the Zernike coefficients. The adjustment value transmission module 10l then transmits the adjustment values for the projection lens to the error correction mechanism 63a of the aligner 6a shown in FIG. 4. The error correction mechanism 63a adjusts the projection lens of the aligner 6a based on the received adjustment values for the projection lens.

Figure 10:
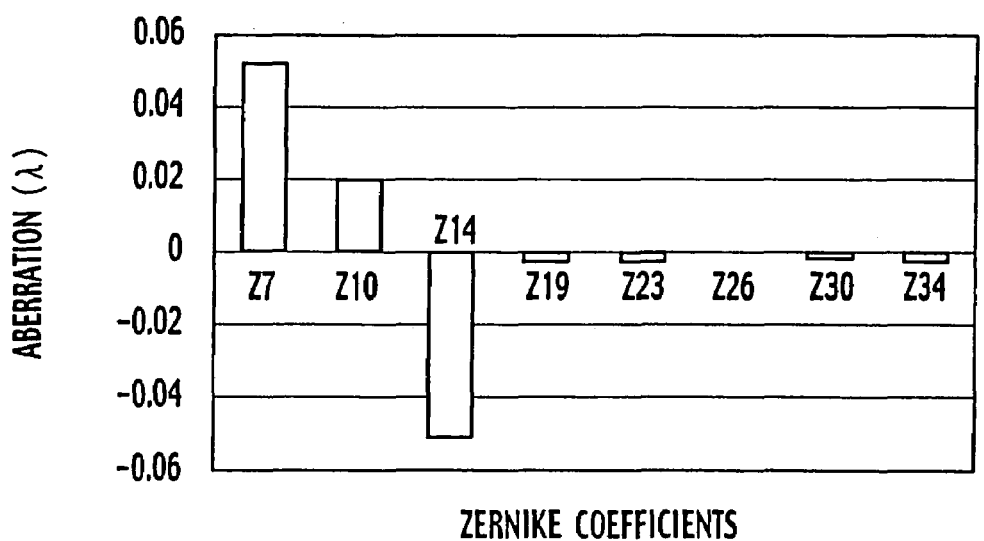
FIG. 10 is a graph showing wavefront aberration of the projection lens corresponding to Zernike coefficients before adjustment according to the first projection lens adjustment processing modification.
Figure 11:
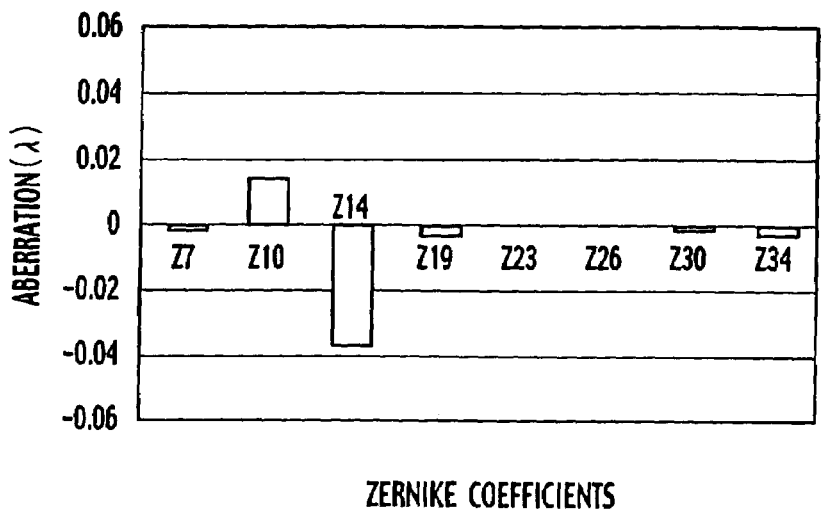
FIG. 11 is a graph showing wavefront aberration of the projection lens corresponding to the Zernike coefficients after adjustment according to the first projection lens adjustment processing modification.
Figure 12:
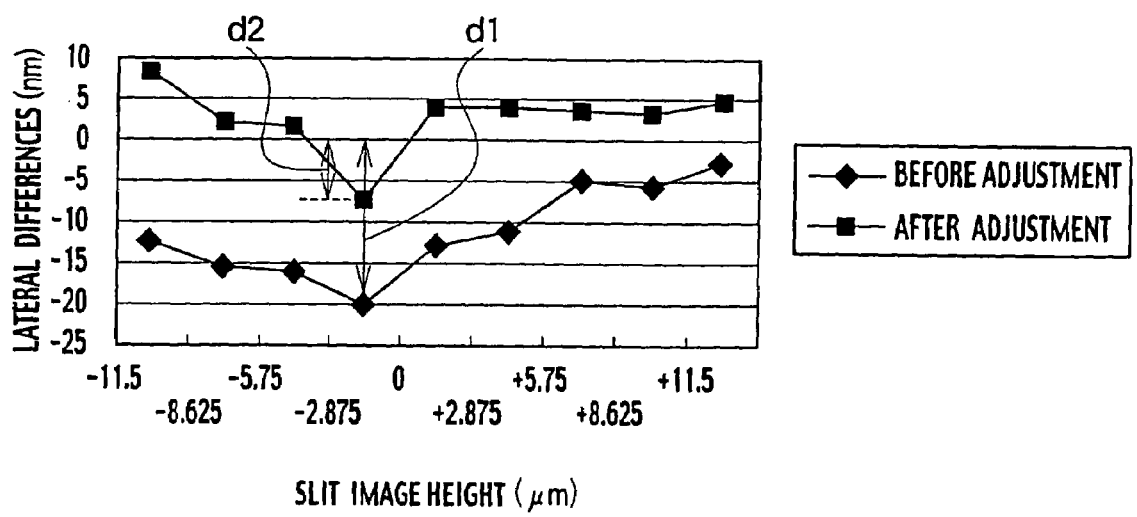
FIG. 12 is a graph showing the lateral differences (diamonds) of the first pattern of the projection lens delineated by the aligner before adjustment, and the lateral differences (squares) of the first pattern of the projection lens delineated by the aligner after adjustment, according to the first projection lens adjustment processing modification.

The lateral axis of FIG. 10 represents the Zernike coefficients, and the longitudinal axis thereof represents aberration of the projection lens before the adjustment. The lateral axis of FIG. 11 represents the Zernike coefficients, and the longitudinal axis thereof represents aberration of the projection lens after the adjustment. By adjusting the projection lens, it is possible to reduce the amounts of aberration corresponding to the Zernike coefficients as shown in FIG. 10 and FIG. 11. The lateral axis of FIG. 12 represents slit image heights, and the longitudinal axis thereof represents lateral differences within an exposure slit of the first pattern 21 delineated by the aligner before and after adjustment of the projection lens. The lateral difference between the image heights h1 and h2 within the exposure slit of the first pattern 21 was about 20 nm at the maximum value d1 before adjustment of the projection lens (plotted with diamonds). By contrast, the lateral difference after adjustment of the projection lens (plotted with squares) is reduced to about 10 nm at the maximum value d2.

(Projection Lens Adjustment Processing Modification—2)

Figure 13A:
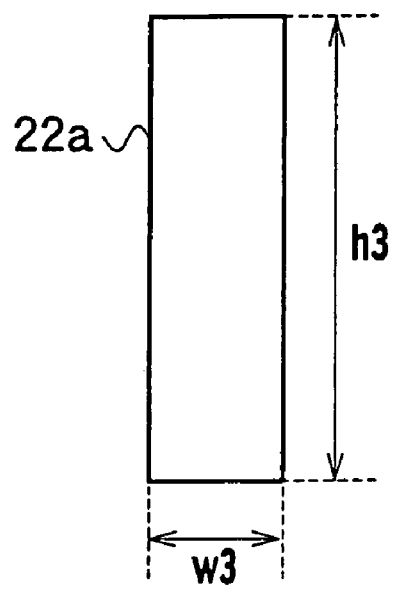
FIG. 13A is a plane view showing the configuration of a second pattern according to the second projection lens adjustment processing modification.
Figure 13B:
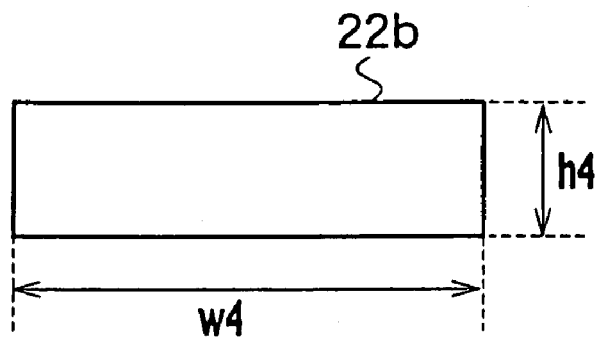
FIG. 13B is a plane view showing the configuration of another second pattern according to the second projection lens adjustment processing modification.
Figure 14:
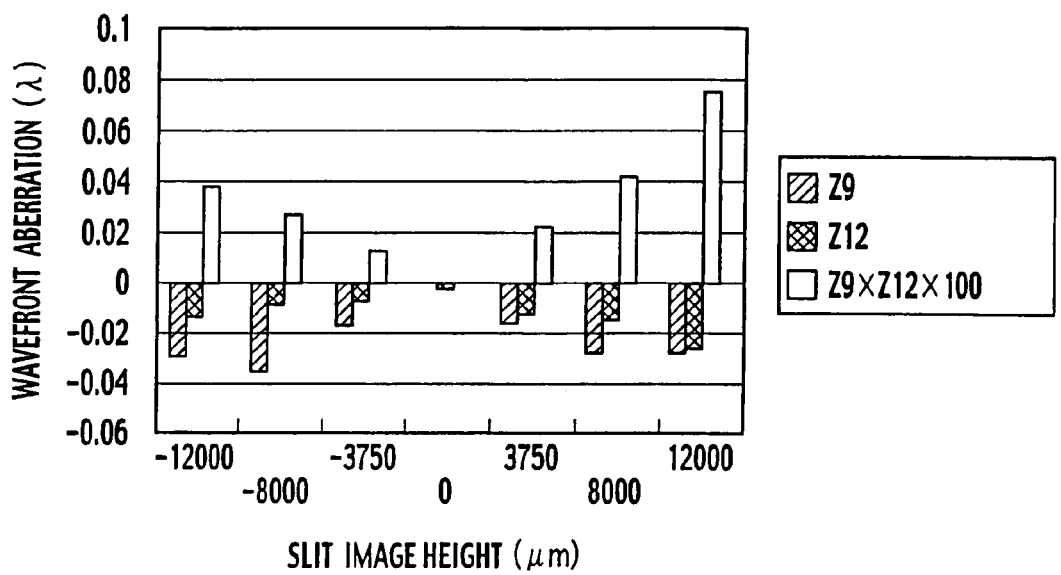
FIG. 14 is a graph showing Z9 and Z12 image heights (image widths) of the second pattern delineated by the aligner before adjusting the projection lens according to the second projection lens adjustment processing modification.

Next, as another example of the projection lens adjustment processing, description will be made regarding the case of adjusting the projection lens of the aligner 6b while the mask has the pattern for delineating a second pattern. The second pattern includes a set of an isolated longitudinal pattern 22a shown in FIG. 13A and a lateral pattern 22b shown in FIG. 13B, which has the same shape as the longitudinal pattern 22a and is orthogonal thereto. An image width w3 of the longitudinal pattern 22a and an image height h4 of the lateral pattern 22b have the same dimension. An image height h3 of the longitudinal pattern 22a and an image width w4 of the lateral pattern 22b have the same dimension, which is about 0.2 μm. As shown in FIG. 14, the error calculation module 10a calculates wavefront aberration of the projection lens for each slit image height of the longitudinal pattern 22a (the slit image width of the lateral pattern 22b). The lateral axis of FIG. 14 represents the slit image height of the longitudinal pattern 22a (the slit image width of the lateral pattern 22b), and the longitudinal axis thereof represents wavefront aberration of the projection lens before the adjustment thereof. As shown in FIG. 14, it is apparent that the second patterns 22a and 22b are sensitive to the aberration of the projection lens corresponding to an interaction factor (Z9×Z12) of the ninth term (Z9) and the twelfth term (Z12) of the Zernike coefficients.

The adjustment value calculation module 10k calculates optical system error values for optimizing the ratio, for example, between the ninth term (Z9) and the twelfth term (Z12) of the Zernike coefficients as the adjustment values for the projection lens. The adjustment value transmission module 10l then transmits the calculated adjustment values for the projection lens to the error correction mechanism 63b of the aligner 6b shown in FIG. 4. The error correction mechanism 63b adjusts the projection lens based on the adjustment values for the projection lens.

Figure 15:
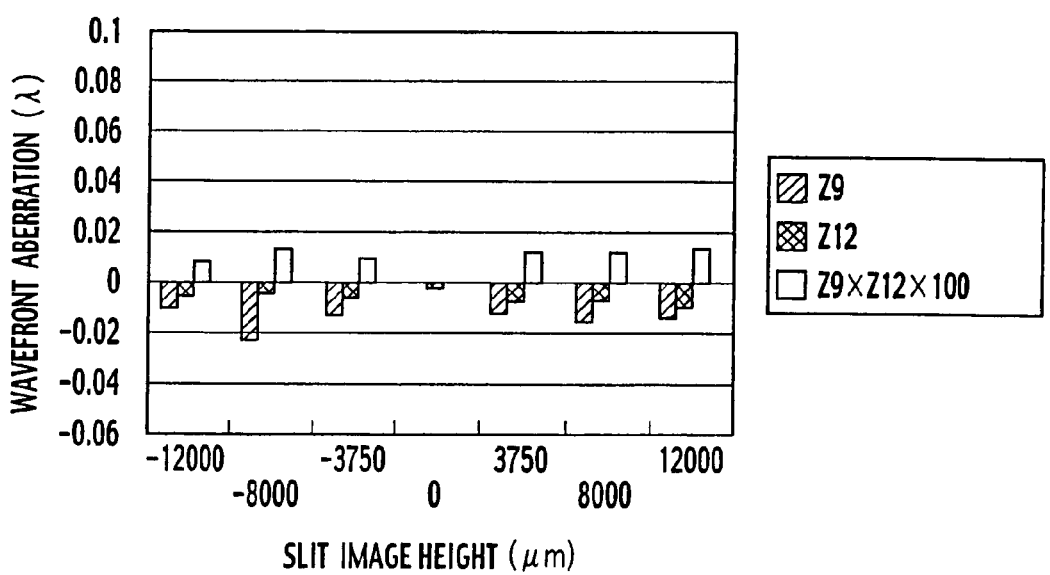
FIG. 15 is a graph showing Z9 and Z12 image heights (image widths) of the second pattern delineated by the aligner after adjusting the projection lens according to the second projection lens adjustment processing modification.
Figure 16:
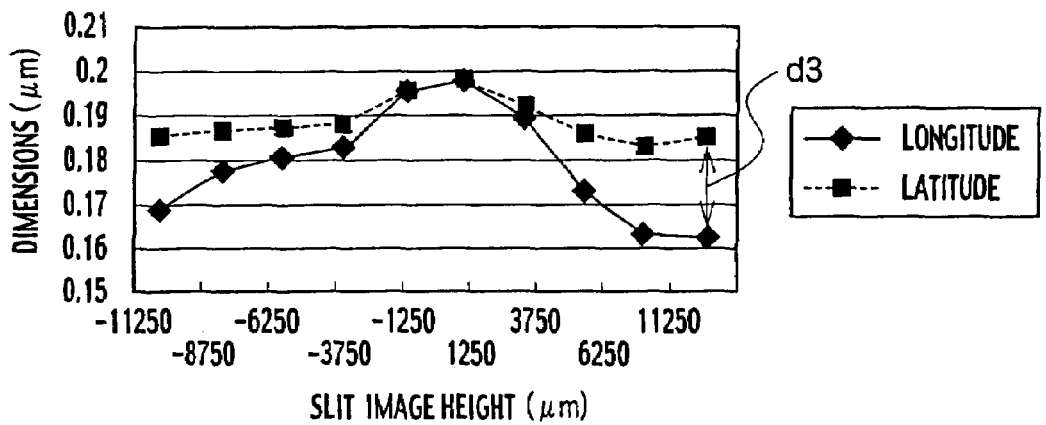
FIG. 16 is a graph showing the critical dimension (CD) of image width of a direction pattern of length and the image height of a transverse direction pattern delineated by the aligner before adjusting the projection lens according to the second projection lens adjustment processing modification.
Figure 17:
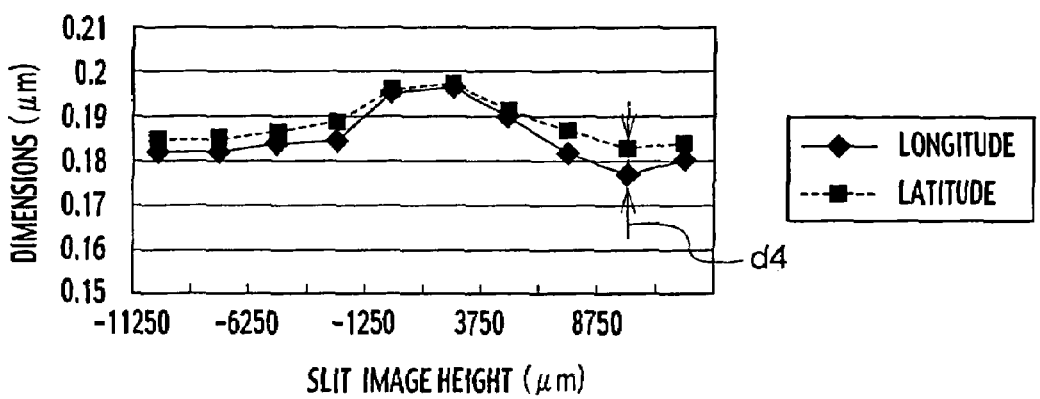
FIG. 17 is a graph showing the critical dimension (CD) of image width of a direction pattern of length and the image height of a transverse direction pattern delineated by the aligner after adjusting the projection lens according to the second projection lens adjustment processing modification.
Figure 18:
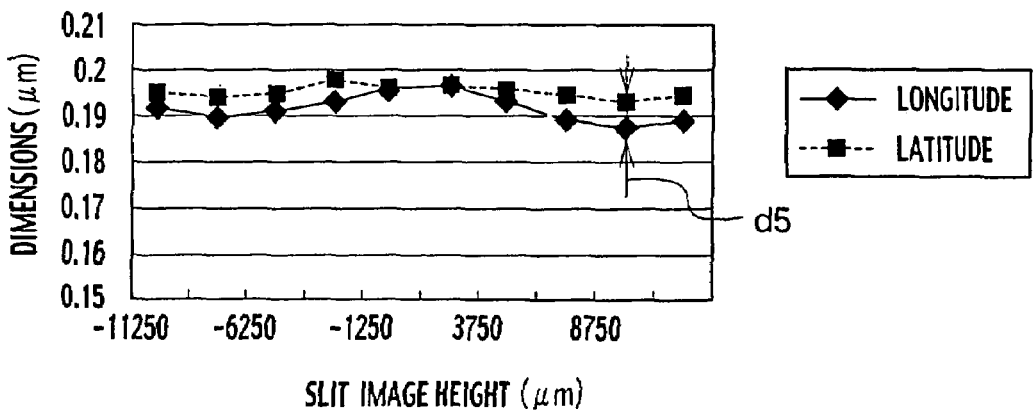
FIG. 18 is a graph showing the critical dimension (CD) of image width of the direction pattern of length, and the image height of a transverse direction pattern delineated by the aligner after further adjusting uneven illuminance after adjusting the projection lens according to the second projection lens adjustment processing modification.

The lateral axis of FIG. 15 represents the slit image height of the longitudinal pattern 22a (the slit image width of the lateral pattern 22b), and the longitudinal axis thereof represents wavefront aberration of the projection lens after the adjustment thereof. The aberration of the projection lens can be reduced as shown in FIG. 15. By adjusting the projection lens, the lateral axis of FIG. 16 represents the slit image height of the longitudinal pattern 22a (the slit image width of the lateral pattern 22b), and the longitudinal axis thereof represents the dimensions of the image width w3 of the longitudinal pattern 22a and the image height h4 of the lateral pattern 22b which are delineated by the aligner 6b before the adjustment of the projection lens. The lateral axis of FIG. 17 represents the slit image height of the longitudinal pattern 22a (the slit image width of the lateral pattern 22b), and the longitudinal axis thereof represents the dimensions of the image width w3 of the longitudinal pattern 22a and the image height h4 of the lateral pattern 22b which are delineated by the aligner 6b after the adjustment of the projection lens. A dimensional difference between the image width w3 of the longitudinal pattern 22a and the image height h4 of the lateral pattern 22b was about 20 nm at the maximum value d3 before the adjustment of the projection lens as shown in FIG. 16. However, the dimensional difference can be reduced to about 5 nm at the maximum value d4 after the adjustment of the projection lens as shown in FIG. 17. The lateral axis of FIG. 18 represents the slit image height of the longitudinal pattern 22a (the slit image width of the lateral pattern 22b), and the longitudinal axis thereof represents the dimensions of the image width w3 of the longitudinal pattern 22a and the image height h4 of the lateral pattern 22b which are delineated by the aligner 6b after the adjustment of the projection lens and further adjustment of uneven illumination. As shown in FIG. 18, the dimensional difference between the image width w3 of the longitudinal pattern 22a and the image height h4 of the lateral pattern 22b can be further reduced by adjusting the uneven illumination after the adjustment of the projection lens. Note that the adjustment values for the projection lens depend on the design guidelines of each new product, and are not particularly limited.

(Method for Manufacturing a Semiconductor Device)

Next, description will be made regarding a method for manufacturing a semiconductor device (a large-scale integrated circuit: LSI) by use of the aligner evaluation system as well as the aligner evaluation method described above, and the aligner evaluation program, with reference to FIG. 19.

Figure 19:
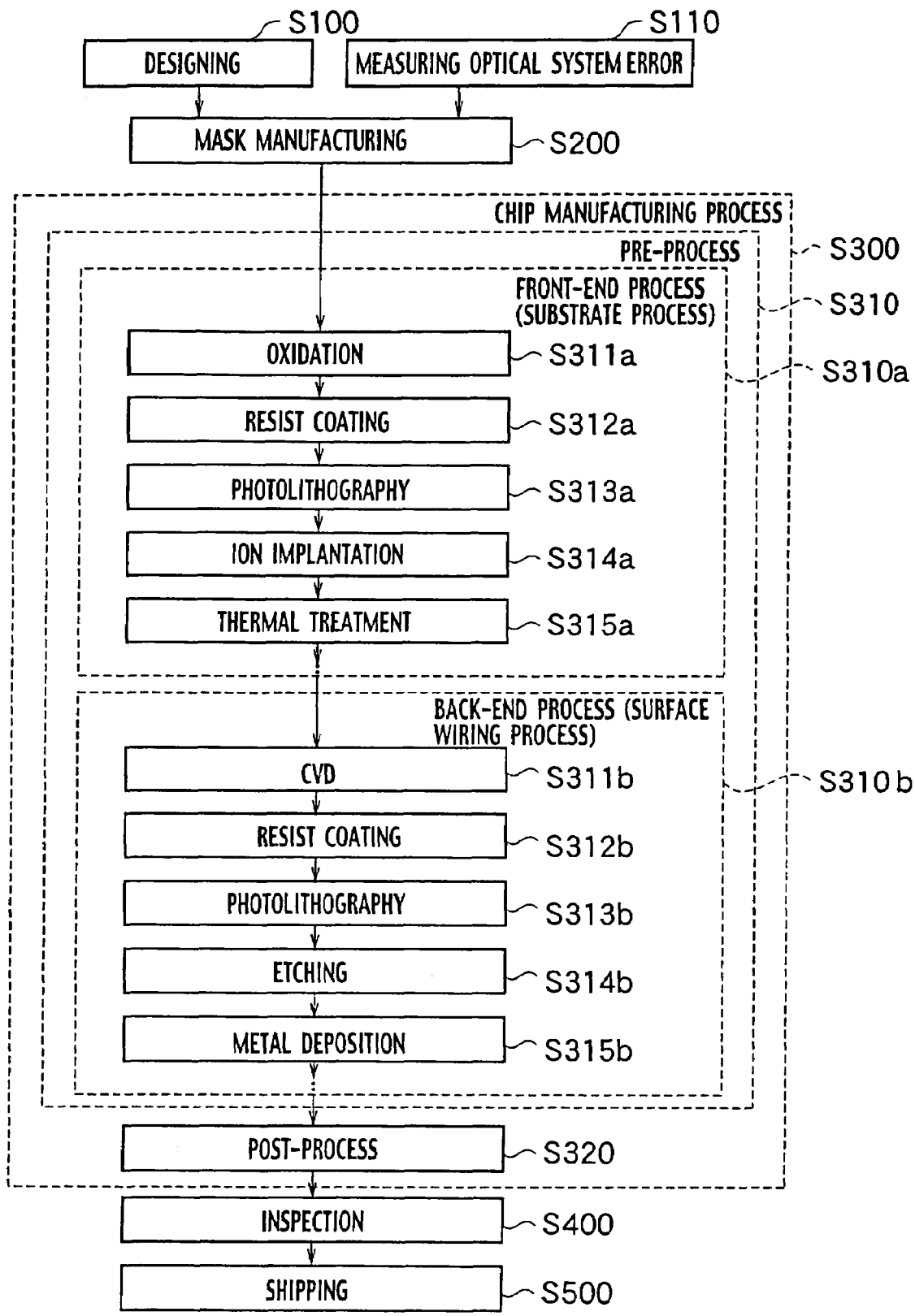
FIG. 19 is a flowchart for explaining a process for manufacturing a semiconductor device according to the embodiment of the present invention.

As shown in FIG. 19, the method for manufacturing a semiconductor device according to the embodiment of the present invention includes a designing process in Step S100, a mask manufacturing and aligner evaluating process in Step S200, and a chip manufacturing process in Step S300. The mask manufacturing and aligner evaluating process in Step S200 includes the aligner evaluating process using the aligner evaluation system, the aligner evaluation method, and the aligner evaluation program according to the embodiment of the present invention, in addition to the mask manufacturing process. The chip manufacturing process in Step S300 includes a pre-process (wafer process) for fabricating an integral circuit on a silicon wafer in Step S310, and a post-process (assembly process) from dicing to inspection in Step S320. Now, description will be made below regarding the details of the respective processes.

(A) First, process mask simulation is carried out in Step S100. Device simulation is performed by use of a result of the process mask simulation and each value of currents and voltages to be input to each of the electrodes. Circuit simulation of the LSI is performed by use of electric properties obtained by the device simulation, and a circuit layout is thereby determined.

(B) In Step S110, photoresist film coated on wafer surfaces is exposed, by use of masks having test patterns for aberration measurement, with a plurality of aligners expected to be used in a photolithography process, for example, the aligners 6a to 6n shown in FIG. 2. The photoresist is then developed and the photoresist evaluation patterns for aberration measurement are delineated on the wafer surfaces. Thereafter, each shape of the photoresist evaluation patterns provided by the respective aligners 6a to 6n are actually measured by use of the measuring device such as an SEM. Thereafter, the measurement results of the shapes of the evaluation patterns by the measuring device 7a are transmitted to the error calculation module 10a of the evaluation server 2 through the communication network 3.

(C) In Step S200, the mask manufacturing and aligner evaluating process takes place by use of the following procedures (a) to (d).
(a) First, pattern data of the masks (writing mask data) corresponding to respective layers and internal structures of a semiconductor chip are determined by use of a CAD system, based on surface patterns such as the circuit layout determined in the designing process of Step S100. Furthermore, the mask patterns corresponding to the respective processes are delineated on mask substrates made of fused silica or the like, by use of the pattern data of the masks, with a pattern generator such as an electron beam (EB) aligner, and the masks are thereby fabricated.
(b) Next, the error calculation module 10a shown in FIG. 3 calculates the error information on the mutual optical system errors among the plurality of aligners 6a to 6n by use of the measurement results obtained in Step S110. The simulation module 10b then simulates the device patterns to be delineated by the respective aligners, based on the calculated optical system error information (see Step S122 in FIG. 5). The evaluation module 10c evaluates whether the plurality of aligners 6a to 6n have the appropriate performances for implementing the organization of the product development machine group based on the simulated device patterns. The aligners evaluated to have the appropriate performance for implementing the organizations of the product development machine group, for example, the aligners 6a to 6c are used in the photolithography processes in Steps S313a and S313b.
(c) Meanwhile, the other aligners 6d to 6n evaluated not to have the appropriate performances for implementing the organization of the product development machine group are subjected to the projection lens adjustment processing (Step S150 in FIG. 6), the optical proximity correction processing (Step S180 in FIG. 7), and the like. Thereafter, the determination as to whether the aligners 6d to 6n have the appropriate performances for implementing the organization of the product development machine group, and other procedures are repeated. The aligners evaluated to have the appropriate performances for implementing the organization of the product development machine group, for example, the aligners 6d to 6f are used in the photolithography processes in Steps S313a and S313b.
(d) When a demand arises for fabrication of optical proximity corrected masks or alternative masks adopting alternative patterns for the aligners 6g to 6n which are still evaluated to be unsatisfactory for product development in spite of the adjustment of the projection lenses or the optical proximity correction, the suitable optical proximity corrected masks and the alternative masks are fabricated (see Step S230 in FIG. 7). Thereafter, the aligners 6g to 6n equipped with the optical proximity corrected masks or the alternative masks are subjected to evaluated as to whether the aligners 6g to 6n have the appropriate performances for implementing the organization of the product development machine group in accordance with the procedures shown in the flowcharts of FIG. 5 to FIG. 7. The aligners evaluated to have the appropriate performance, for example, the aligners 6g to 6i are used in the photolithography processes in Steps S313a and S313b.
(D) Next, a series of processes including an oxidation process in Step S311a, a resist coating process in Step S312a, the photolithography process in Step S313a, an ion implantation process in Step S314a, a thermal treatment process in Step S315a, and the like are repeatedly performed in a front-end process (substrate process) in Step 310a. In Step S313a, photoresist films on semiconductor wafers are exposed by the step-and-repeat method and thereby patterned, by use of the masks fabricated with the pattern generator in Step S200, with the aligners evaluated appropriate for use in the product development machine group by the evaluation module 10c, for example, the aligners 6a to 6f. It is also possible to use the aligners 6g to 6i which are equipped with the alternative masks or the optical proximity corrected masks instead of the initial masks. When the above-described series of processes are completed, the procedure advances to Step S310b.
(E) Next, a back-end process (surface wiring process) for wiring the substrate surface is performed in Step S310b. A series of processes including a chemical vapor deposition (CVD) process in Step S311b, a resist coating process in Step S312b, the photolithography process in Step S313b, an etching process in Step 314b, a metal deposition process in Step 315b, and the like are repeatedly performed in the back-end process. In Step S313b, etching masks made of photoresist are formed by exposure using the masks fabricated with the pattern generator in Step S200 and the aligners 6a to 6f evaluated appropriate for use in the product development machine group by the evaluation module 10c. It is also possible to use the aligners 6g to 6i which are equipped with the alternative masks or the optical proximity corrected masks instead of the initial masks. When the above-described series of processes are completed, the procedure advances to Step S320.
(F) When a multilayer wiring structure is competed and the pre-process is finished, the substrate is diced into chips with a given size by a dicing machine such as a diamond blade in Step S320. The chip is then mounted on a packaging material made of metal, ceramic or the like. After electrode pads on the chip and leads on a leadframe are connected to one another with gold wires, a desired package assembly process such as plastic molding is performed.
(G) In Step S400, the semiconductor device is completed after an inspection of properties concerning performances and functions of the semiconductor device, and other given inspections on lead shapes, dimensional conditions, a reliability test, and the like. In Step S500, the semiconductor device which has cleared the above-described processes is packaged to be protected against moisture, static electricity and the like, and is then shipped out.

According to the method for manufacturing a semiconductor device of the embodiment of the present invention, it is possible to promptly select the aligners appropriate for use in the product development, out of the aligners 6a to 6n in the photolithography processes in Steps S313a and S313b. Therefore, it is possible to avoid reduction in yields, to reduce manufacturing costs, and to effectuate mass production in a short time.

(Aligner Determining Program)

Next, the details for execution of the instruments of the aligner evaluation program according to the embodiment of the present invention are described.

The aligner evaluation program according to the embodiment of the present invention executes an application on the aligner evaluation system, the computer program product provides (A) instructions configured to calculate the error information on the mutual optical system errors among the plurality of aligners 6a to 6n; (B) instructions configured to simulate device patterns to be delineated based on the error information on the optical system errors, the lithography conditions, the information on the machine quality control, CAD data, etc. respectively stored in the error information storage unit 13a, the lithography condition storage unit 13b, the machine quality control information storage units 13*l*, and the CAD data storage unit 14*a*; (C) instructions configured to evaluate whether each of the aligners 6*a* to 6*n* has appropriate performances for implementing the organization of the product development machine group based on the device patterns simulated by simulation module 10*b*; (D) instructions configured to extract optimal exposure conditions for the device patterns simulated by the simulation module 10*b*; (E) instructions configured to extract virtual dangerous patterns from among the device patterns simulated by the simulation module 10*b*; (F) instructions configured to extract dangerous patterns coordinates value based on the CAD data stored in CAD data storage unit 14*a*; (G) instructions configured to convert coordinate system of the dangerous pattern extracted by the virtual dangerous pattern extraction module 10*e* into the measurement coordinates values; (H) instructions configured to transmit for the measurement coordinates value calculated by the coordinate system conversion module 10*g* to the measuring device 7*a* connected by the communication I/F 18 through the communication network 3; (I) instructions configured to receive the measurement result of the shape of the actual dangerous patterns measured by the measuring device 7*a* through the communication network 3; (J) instructions configured to compare the shape of the dangerous patterns received by the actual dangerous pattern reception module 13*l* with the shape of the virtual dangerous patterns stored in the virtual dangerous pattern storage unit 13*f*, and to confirm whether the shape of the actual dangerous pattern corresponds with the shape of the dangerous pattern; (K) instructions configured to respectively calculate the adjustment value of projection lens of the aligners 6*a* to 6*n* based on the optical system error information calculated by the error calculation module 10*a*; (L) instructions configured to transmit the adjustment value of the projection lens calculated by the adjustment value calculation module 10*k* to the optical system errors compensation mechanisms 63*a*, 63*b*, and 63*c*, . . . 63*n* of corresponding with the each aligner 6*a*, 6*b*, 6*c*, . . . , and 6*n*, through the communication network 3 shown in FIG. 2; (M) instructions configured to carry out the optical proximity correction based on the shape of dangerous patterns, and the optical proximity correction amount; (N) instructions configured to simulate the plurality of virtual device patterns differing in shape from the device patterns simulated by simulation module 10*b*; and, (O) instructions configured to extract the virtual device patterns having the identified function but differing in shape from the virtual dangerous pattern as an alternative pattern.

The above-described aligner evaluation program can be stored in a computer-readable recording medium such as the program storage unit 12. The above-described aligner evaluation system can be achieved by allowing a computer system, such as the CPU 10 shown in FIG. 3, to read the recording medium so as to execute the aligner evaluation program for controlling the computer.

OTHER EMBODIMENTS

The above-described embodiment of the present invention has showed a plurality of (the first to n-th) factories 5*a* to 5*n*. However, the number of factories to be connected to the communication network 3 is not particularly limited. Moreover, the numbers of aligners and the measuring devices, which are disposed in each of the first to n-th factories 5*a* to 5*n*, and arrangement thereof are not particularly limited. Furthermore, the evaluation server 2 is located in the headquarters 1 in the embodiment of the present invention. However, the location of the evaluation server 2 is not particularly limited as long as the evaluation server 2 is connected to the communication network 3. For example, the evaluation server 2 may be located inside the first factory 5*a* or the second factory 5*b*.

Various modifications will become possible for those skilled in the art after receiving the teachings of the present disclosure without departing from the scope thereof.

What is claimed is:

1. An evaluation system comprising hardware resources of:
    an error calculation module configured to calculate error information on mutual optical system errors among plurality of aligners;
    a simulation module configured to simulate device patterns to be delineated by each of the aligners based on the error information;
    an evaluation module configured to evaluate whether each of the aligners has appropriate performances, which are determined by design specifications required by a product, for electing a group of appropriate aligners based on the simulated device patterns;
    a virtual dangerous pattern extraction module configured to extract a pattern, which is defined by standard values required by design guidelines of the product, as a virtual dangerous pattern for each of the elected aligners among the simulated device patterns; and
    a confirmation module configured to compare a shape of the virtual dangerous pattern with a shape of an actual dangerous pattern actually delineated by exposing the virtual dangerous pattern on an exposed object, for each of the elected aligners, so as to determine whether each of the elected aligners can be used for manufacturing the product.

2. The evaluation system of claim 1, further comprising a hardware resource of an adjustment value calculation module configured to calculate an adjustment value of a projection lens for each of the elected aligners based on the error information.

3. The evaluation system of claim 1, further comprising a hardware resource of a correction module configured to perform an optical proximity correction based on the shape of the virtual dangerous pattern.

4. The evaluation system of claim 1, further comprising hardware resources of:
    a virtualization module configured to generate a plurality of virtual device patterns differing shape from the simulated device patterns; and
    an alternative pattern extraction module configured to extract alternative pattern differing in shape from the virtual dangerous pattern but having an identical function with the virtual dangerous pattern among the virtual device patterns.

5. The evaluation system of claim 2, wherein the error information pertains to errors attributable to differences of aberration of projection lenses of the plurality of aligners, and errors attributable to differences of illumination optical systems.

6. The evaluation system of claim 5, wherein the errors attributable to the differences of aberration of the projection lenses is converted into Zernike coefficients.

7. The evaluation system of claim 5, wherein the errors attributable to the difference of the illumination optical systems are at least one of uneven illuminance, axial misalignment, and variation of coherence factors of the illumination optical systems.

8. The evaluation system of claim 1, wherein the evaluation module evaluates whether each of the simulated device patterns satisfies a design specification.

9. An evaluation method, comprising:
   calculating error information on mutual optical system errors from among a plurality of aligners;
   simulating device patterns to be delineated by each of the aligners based on the error information;
   evaluating whether each of the aligners has appropriate performances, which are determined by design specifications required by a product, for electing a group of appropriate aligners based on the simulated device patterns;
   extracting a pattern, which is defined by standard values required by design guidelines of the product, as a virtual dangerous pattern for each of the elected aligners among the simulated device patterns;
   exposing and delineating the virtual dangerous pattern on an exposed object, and obtaining an actual dangerous pattern for each of the elected aligners;
   measuring a shape of the actual dangerous pattern; and
   comparing a shape of the virtual dangerous pattern with the shape of the actual dangerous pattern for each of the elected aligners, so as to determine whether each of the elected aligners can be used for manufacturing the product.

10. The evaluation method of claim 9, further comprising calculating an adjustment value of a projection lens for each of the elected aligners based on the error information.

11. The evaluation method of claim 9, further comprising performing an optical proximity correction for each of the aligners based on the virtual dangerous pattern.

12. The evaluation method of claim 9, further comprising:
   simulating plural virtual device patterns differing in shape from the simulated device patterns; and
   extracting alternative patterns differing in shape from the virtual dangerous patterns but having an identical function with the virtual dangerous patterns among the virtual device patterns.

13. The evaluation method of claim 10, wherein the error information pertains to errors attributable to differences of aberration of the projection lenses of the plurality of aligners, and the errors attributable to differences of illumination optical systems.

14. The evaluation method of claim 13, wherein the errors attributable to the differences of aberration of the projection lens is converted into Zernike coefficients.

15. The evaluation method of claim 13, wherein the errors attributable to the difference of the illumination optical systems are at least one of variation in uneven illuminance, axial misalignment, and coherence factors of the illumination optical systems.

16. The evaluation method of claim 9, wherein the evaluating evaluates whether each of the simulated device patterns satisfies design specification.

17. A computer program product within a computer-readable recording medium for executing an application on an aligner evaluation system, the computer program product comprising:
   instructions within the computer-readable recording medium configured to calculate error information on mutual optical system errors of a plurality of aligners;
   instructions within the computer-readable recording medium configured to simulate device patterns to be delineated by each of the aligners based on the error information;
   instructions within the computer-readable recording medium configured to evaluate whether each of the aligners has appropriate performances, which are determined by design specifications required by a product, for electing a group of appropriate aligners based on the simulated device patterns;
   instructions within the computer-readable recording medium configured to extract a pattern, which is defined by standard values required by guidelines of the product, as a virtual dangerous pattern for each of the elected aligners among the simulated device patterns; and
   instructions within the computer-readable recording medium configured to compare a shape of the virtual dangerous pattern with a shape of an actual dangerous pattern actually delineated by exposing the virtual dangerous pattern on an exposed object, for each of the elected aligners, so as to determine whether each of the elected aligners can be used for manufacturing the product.

18. A method for manufacturing a semiconductor device comprising:
   determining a layout of a device pattern;
   preparing a set of masks produced based on the determined layout;
   calculating error information on mutual optical system errors of a plurality of aligners;
   simulating device patterns to be delineated by each of the aligners based on the error information;
   evaluating whether each of the aligners has appropriate performances, which are determined by design specifications required by a product, for electing a group of appropriate aligners based on the simulated device pattern;
   extracting a pattern, which is defined by standard values required by guidelines of the product, as a virtual dangerous pattern for each of the elected aligners among the simulated device patterns;
   exposing and delineating the virtual dangerous pattern on an exposed object, and obtaining an actual dangerous pattern for each of the elected aligners;
   measuring a shape of the actual dangerous pattern;
   comparing a shape of the virtual dangerous pattern with the shape of the actual dangerous pattern so as to use the elected aligners, which delineates the shape of the actual dangerous pattern for each of the elected aligners, so as to determine whether each of the elected aligners can be used for manufacturing the product;
   coating a photoresist film on a semiconductor wafer; and
   exposing the photoresist film with one of the masks employing one the aligners, which can be used for manufacturing the product.

* * * * *